United States Patent
Grant et al.

(10) Patent No.: US 9,905,237 B2
(45) Date of Patent: *Feb. 27, 2018

(54) DECODING OF ENCODED AUDIO BITSTREAM WITH METADATA CONTAINER LOCATED IN RESERVED DATA SPACE

(71) Applicant: DOLBY LABORATORIES LICENSING CORPORATION, San Francisco, CA (US)

(72) Inventors: Michael Grant, San Francisco, CA (US); Scott Gregory Norcross, San Rafael, CA (US); Jeffrey Riedmiller, Penngrove, CA (US); Michael Ward, Orinda, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/491,661

(22) Filed: Apr. 19, 2017

(65) Prior Publication Data

US 2017/0221496 A1 Aug. 3, 2017

Related U.S. Application Data

(63) Continuation of application No. 14/434,528, filed as application No. PCT/US2014/011672 on Jan. 15, 2014.

(Continued)

(51) Int. Cl.
*G10L 19/16* (2013.01)
*H03G 9/00* (2006.01)
(Continued)

(52) U.S. Cl.
CPC .......... *G10L 19/167* (2013.01); *G10L 19/002* (2013.01); *H03G 9/005* (2013.01); *H03G 9/025* (2013.01)

(58) Field of Classification Search
None
See application file for complete search history.

(56) References Cited

U.S. PATENT DOCUMENTS 5,583,962 A 12/1996 Davis
5,632,005 A 5/1997 Davis
(Continued)

FOREIGN PATENT DOCUMENTS

CN 1973434 5/2007
CN 102754151 10/2012
(Continued)

OTHER PUBLICATIONS

"Digital Audio Compression (AC-3) Enhanced 1-15 AC-3) Standard: JTC-026v131" ETSI Draft JTC-026V131, European Telecommunications Standards Institute, Jan. 7, 2014, pp. 1-227.
(Continued)

*Primary Examiner* — Richa Mishra

(57) ABSTRACT

Apparatus and methods for generating an encoded audio bitstream, including by including program loudness metadata and audio data in the bitstream, and optionally also program boundary metadata in at least one segment (e.g., frame) of the bitstream. Other aspects are apparatus and methods for decoding such a bitstream, e.g., including by performing adaptive loudness processing of the audio data of an audio program indicated by the bitstream, or authentication and/or validation of metadata and/or audio data of such an audio program. Another aspect is an audio processing unit (e.g., an encoder, decoder, or post-processor) configured (e.g., programmed) to perform any embodiment of the method or which includes a buffer memory which stores
(Continued)

at least one frame of an audio bitstream generated in accordance with any embodiment of the method.

6 Claims, 6 Drawing Sheets

Related U.S. Application Data

(60) Provisional application No. 61/824,010, filed on May 16, 2013, provisional application No. 61/754,882, filed on Jan. 21, 2013.

(51) Int. Cl.
*G10L 19/002* (2013.01)
*H03G 9/02* (2006.01)

(56) References Cited

U.S. PATENT DOCUMENTS

| | | | |
|---|---|---|---|
| 5,633,981 A | 5/1997 | Davis | |
| 5,727,119 A | 3/1998 | Davidson | |
| 6,446,037 B1 | 9/2002 | Fielder | |
| 2004/0044525 A1* | 3/2004 | Vinton | H03G 5/165 704/224 |
| 2004/0123109 A1* | 6/2004 | Choi | H04L 9/3239 713/176 |
| 2006/0039482 A1 | 2/2006 | Cho | |
| 2006/0158613 A1 | 7/2006 | Fancher | |
| 2006/0256972 A1* | 11/2006 | Roy | H04N 21/235 381/23 |
| 2008/0080722 A1 | 4/2008 | Carroll | |
| 2009/0063159 A1* | 3/2009 | Crockett | G10L 19/167 704/500 |
| 2009/0164378 A1* | 6/2009 | West | G06Q 10/06 705/55 |
| 2010/0272290 A1 | 10/2010 | Carroll | |
| 2012/0046956 A1 | 2/2012 | Stewart | |
| 2012/0124573 A1* | 5/2012 | Mamtani | H04N 21/233 718/1 |
| 2012/0130721 A1 | 5/2012 | Sirivara | |
| 2012/0287999 A1 | 11/2012 | Li | |

FOREIGN PATENT DOCUMENTS

| | | |
|---|---|---|
| CN | 102792588 | 11/2012 |
| JP | 5166241 | 9/2008 |
| KR | 10-1996-0012804 | 4/1996 |
| KR | 10-2008-0059156 | 6/2008 |
| KR | 10-0860984 | 9/2008 |
| TW | 200638335 | 11/2006 |
| WO | 2005/069612 | 7/2005 |
| WO | 2005/125217 | 12/2005 |
| WO | 2006/113062 | 10/2006 |
| WO | 2008/136608 | 11/2008 |
| WO | 2012/075246 | 6/2012 |
| WO | 2012/138594 | 10/2012 |
| WO | 2012/146757 | 11/2012 |

OTHER PUBLICATIONS

ATSC Standard: Digital Audio Compression (AC-3, E-AC-3), Doc A/52:2012, Mar. 23, 2012, pp. 1-269.
ATSC: "ATSC Standard: Digital Audio Compression (AC-3), Revision A, Doc A/52A", Aug. 20, 2001, pp. 1-140.
EBU-Tech 3341, "Loudness Metering: EBU Mode Metering to Supplement Loudness Normalisation in Accordance with EBU R 128" Geneva, Aug. 2011.
ETSI Digital Audio Compression (AC-3, Enhanced AC-3) Standard TS 102 366 v1.3.1 Jan. 7, 2014, pp. 1-227.
Fielder L.D. et al. "Introduction to Dolby Digital Plus, an Enhancement to the Dolby Digital Coding System" Preprints of Papers Presented at the AES Convention, Oct. 28, 2004, pp. 1-30.
Fielder, L. et al "Professional Audio Coder Optimized for Use with Video" AES Preprint, 5033, 107th AES Conference, Sep. 1, 1999.
ITU-R BS.1770-3, "Algorithms to Measure Audio Programme Loudness and True-Peak Audio Level" Aug. 2012.
Truman, M. et al "Efficient Bit Allocation, Quantization, and Coding in an Audio Distribution System" AES Convention 107, Sep. 1, 1999.

\* cited by examiner

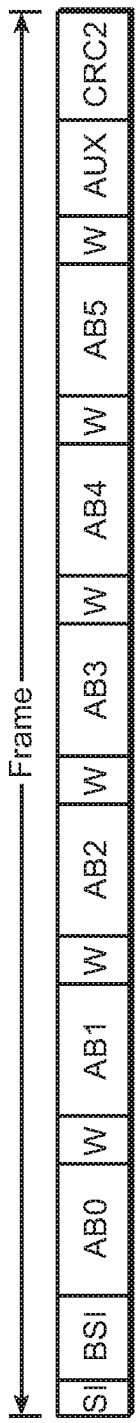
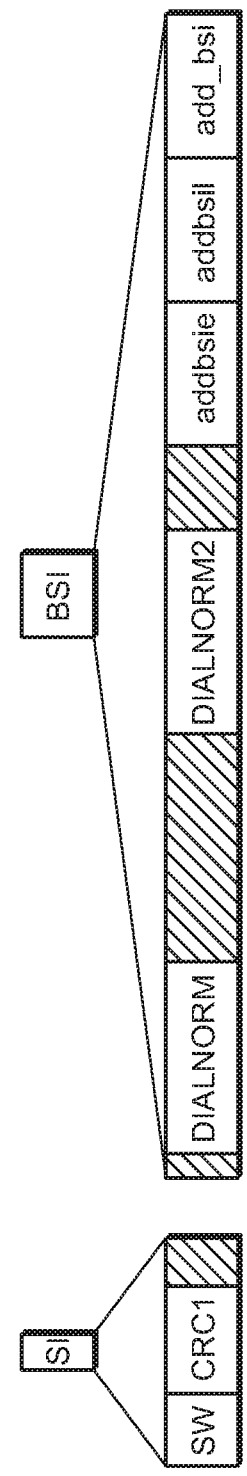
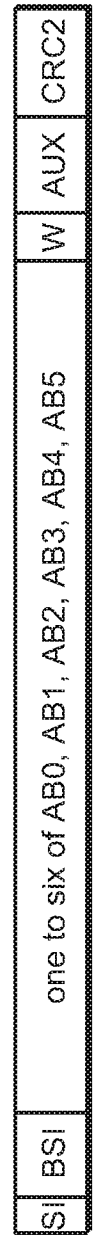
FIG. 4
FIG. 5
FIG. 6
FIG. 7

FIG. 8

| Frame # | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Frames to Boundary | -16 | -15 | -14 | -13 | -12 | -11 | -10 | -9 | -8 | -7 | -6 | -5 | -4 | -3 | -2 | -1 |
| Program Boundary Flag Contents | 100011 | 0 | 0 | 0 | 0 | 0 | 0 | 0 | 10011 | 0 | 0 | 0 | 1011 | 0 | 111 | 0 |
| Exist | 1 | 0 | 0 | 0 | 0 | 0 | 0 | 0 | 1 | 0 | 0 | 0 | 1 | 0 | 1 | 0 |
| Frame Counter | 0001->16 | | | | | | | | 001->8 | | | | 01->4 | | 1->2 | |
| Count UP (+) / Down (-) | 1 | | | | | | | | 1 | | | | 1 | | 1 | |

(Syntax of Program Boundary Flag Counting Down to Program Boundary)

FIG. 9

| Frame # | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Frames to Boundary | 0 | 1 | 2 | 3 | 4 | 5 | 6 | 7 | 8 | 9 | 10 | 11 | 12 | 13 | 14 | 15 |
| Program Boundary Flag Contents | 110 | 0 | 1010 | 0 | 0 | 0 | 0 | 10010 | 0 | 0 | 0 | 0 | 0 | 0 | 0 | 10010 |
| Exist | 1 | 0 | 1 | 0 | 0 | 0 | 0 | 1 | 0 | 0 | 0 | 0 | 0 | 0 | 0 | 1 |
| Frame Counter | 1->2 | | 01->4 | | | | | 001->8 | | | | | | | | 0001->16 |
| Count UP (+) / Down (-) | 0 | | 0 | | | | | 0 | | | | | | | | 0 |

(Syntax of Program Boundary Flag Counting Up for Beginning of Program)

Scenario 1: P1 and P2 Both Have Flags

Scenario 2: Only P1 Has Flags

Scenario 3: End of P1 Spliced

Scenario 4: End of P1, Start of P2 Spliced

DECODING OF ENCODED AUDIO BITSTREAM WITH METADATA CONTAINER LOCATED IN RESERVED DATA SPACE

TECHNICAL FIELD

The invention pertains to audio signal processing, and more particularly, to encoding and decoding of audio data bitstreams with metadata indicative of the loudness processing state of audio content and the location of audio program boundaries indicated by the bitstreams. Some embodiments of the invention generate or decode audio data in one of the formats known as AC-3, Enhanced AC-3 or E-AC-3, or Dolby E.

BACKGROUND OF THE INVENTION

Dolby, Dolby Digital, Dolby Digital Plus, and Dolby E are trademarks of Dolby Laboratories Licensing Corporation. Dolby Laboratories provides proprietary implementations of AC-3 and E-AC-3 known as Dolby Digital and Dolby Digital Plus, respectively.

Audio data processing units typically operate in a blind fashion and do not pay attention to the processing history of audio data that occurs before the data is received. This may work in a processing framework in which a single entity does all the audio data processing and encoding for a variety of target media rendering devices while a target media rendering device does all the decoding and rendering of the encoded audio data. However, this blind processing does not work well (or at all) in situations where a plurality of audio processing units are scattered across a diverse network or are placed in tandem (i.e., chain) and are expected to optimally perform their respective types of audio processing. For example, some audio data may be encoded for high performance media systems and may have to be converted to a reduced form suitable for a mobile device along a media processing chain. Accordingly, an audio processing unit may unnecessarily perform a type of processing on the audio data that has already been performed. For instance, a volume leveling unit may perform processing on an input audio clip, irrespective of whether or not the same or similar volume leveling has been previously performed on the input audio clip. As a result, the volume leveling unit may perform leveling even when it is not necessary. This unnecessary processing may also cause degradation and/or the removal of specific features while rendering the content of the audio data.

A typical stream of audio data includes both audio content (e.g., one or more channels of audio content) and metadata indicative of at least one characteristic of the audio content. For example, in an AC-3 bitstream there are several audio metadata parameters that are specifically intended for use in changing the sound of the program delivered to a listening environment. One of the metadata parameters is the DIALNORM parameter, which is intended to indicate the mean level of dialog occurring an audio program, and is used to determine audio playback signal level.

During playback of a bitstream comprising a sequence of different audio program segments (each having a different DIALNORM parameter), an AC-3 decoder uses the DIALNORM parameter of each segment to perform a type of loudness processing in which it modifies the playback level or loudness of such that the perceived loudness of the dialog of the sequence of segments is at a consistent level. Each encoded audio segment (item) in a sequence of encoded audio items would (in general) have a different DIALNORM parameter, and the decoder would scale the level of each of the items such that the playback level or loudness of the dialog for each item is the same or very similar, although this might require application of different amounts of gain to different ones of the items during playback.

DIALNORM typically is set by a user, and is not generated automatically, although there is a default DIALNORM value if no value is set by the user. For example, a content creator may make loudness measurements with a device external to an AC-3 encoder and then transfer the result (indicative of the loudness of the spoken dialog of an audio program) to the encoder to set the DIALNORM value. Thus, there is reliance on the content creator to set the DIALNORM parameter correctly.

There are several different reasons why the DIALNORM parameter in an AC-3 bitstream may be incorrect. First, each AC-3 encoder has a default DIALNORM value that is used during the generation of the bitstream if a DIALNORM value is not set by the content creator. This default value may be substantially different than the actual dialog loudness level of the audio. Second, even if a content creator measures loudness and sets the DIALNORM value accordingly, a loudness measurement algorithm or meter may have been used that does not conform to the recommended AC-3 loudness measurement method, resulting in an incorrect DIALNORM value. Third, even if an AC-3 bitstream has been created with the DIALNORM value measured and set correctly by the content creator, it may have been changed to an incorrect value during transmission and/or storage of the bitstream. For example, it is not uncommon in television broadcast applications for AC-3 bitstreams to be decoded, modified and then re-encoded using incorrect DIALNORM metadata information. Thus, a DIALNORM value included in an AC-3 bitstream may be incorrect or inaccurate and therefore may have a negative impact on the quality of the listening experience.

Further, the DIALNORM parameter does not indicate the loudness processing state of corresponding audio data (e.g. what type(s) of loudness processing have been performed on the audio data). Until the present invention, an audio bitstream had not included metadata, indicative of the loudness processing state (e.g., type(s) of loudness processing applied to) the audio content of the audio bitstream or the loudness processing state and loudness of the audio content of the bitstream, in a format of a type described in the present disclosure. Loudness processing state metadata in such a format is useful to facilitate adaptive loudness processing of an audio bitstream and/or verification of validity of the loudness processing state and loudness of the audio content, in a particularly efficient manner.

Although the present invention is not limited to use with an AC-3 bitstream, an E-AC-3 bitstream, or a Dolby E bitstream, for convenience it will be described in embodiments in which it generates, decodes, or otherwise processes such a bitstream which includes loudness processing state metadata.

An AC-3 encoded bitstream comprises metadata and one to six channels of audio content. The audio content is audio data that has been compressed using perceptual audio coding. The metadata includes several audio metadata parameters that are intended for use in changing the sound of a program delivered to a listening environment.

Details of AC-3 (also known as Dolby Digital) coding are well known and are set forth many published references including the following:

*ATSC Standard A52/A: Digital Audio Compression Standard (AC-3), Revision A*, Advanced Television Systems Committee, 20 Aug. 2001; and U.S. Pat. Nos. 5,583,962; 5,632,005; 5,633,981; 5,727,119; and 6,021,386, all of which are hereby incorporated by reference in their entirety.

Details of Dolby Digital Plus (E-AC-3) coding are set forth in "Introduction to Dolby Digital Plus, an Enhancement to the Dolby Digital Coding System," AES Convention Paper 6196, 117th AES Convention, Oct. 28, 2004.

Details of Dolby E coding are set forth in "Efficient Bit Allocation, Quantization, and Coding in an Audio Distribution System", AES Preprint 5068, 107th AES Conference, August 1999 and "Professional Audio Coder Optimized for Use with Video", AES Preprint 5033, 107th AES Conference August 1999.

Each frame of an AC-3 encoded audio bitstream contains audio content and metadata for 1536 samples of digital audio. For a sampling rate of 48 kHz, this represents 32 milliseconds of digital audio or a rate of 31.25 frames per second of audio.

Each frame of an E-AC-3 encoded audio bitstream contains audio content and metadata for 256, 512, 768 or 1536 samples of digital audio, depending on whether the frame contains one, two, three or six blocks of audio data respectively. For a sampling rate of 48 kHz, this represents 5.333, 10.667, 16 or 32 milliseconds of digital audio respectively or a rate of 189.9, 93.75, 62.5 or 31.25 frames per second of audio respectively.

As indicated in FIG. 4, each AC-3 frame is divided into sections (segments), including: a Synchronization Information (SI) section which contains (as shown in FIG. 5) a synchronization word (SW) and the first of two error correction words (CRC1); a Bitstream Information (BSI) section which contains most of the metadata; six Audio Blocks (AB0 to AB5) which contain data compressed audio content (and can also include metadata); waste bit segments (W) which contain any unused bits left over after the audio content is compressed; an Auxiliary (AUX) information section which may contain more metadata; and the second of two error correction words (CRC2). The waste bit segment (W) may also be referred to as a "skip field."

As indicated in FIG. 7, each E-AC-3 frame is divided into sections (segments), including: a Synchronization Information (SI) section which contains (as shown in FIG. 5) a synchronization word (SW); a Bitstream Information (BSI) section which contains most of the metadata; between one and six Audio Blocks (AB0 to AB5) which contain data compressed audio content (and can also include metadata); waste bit segments (W) which contains any unused bits left over after the audio content is compressed (although only one waste bit segment is shown, a different waste bit segment would typically follow each audio block); an Auxiliary (AUX) information section which may contain more metadata; and an error correction word (CRC). The waste bit segment (W) may also be referred to as a "skip field."

In an AC-3 (or E-AC-3) bitstream there are several audio metadata parameters that are specifically intended for use in changing the sound of the program delivered to a listening environment. One of the metadata parameters is the DIALNORM parameter, which is included in the BSI segment.

As shown in FIG. 6, the BSI segment of an AC-3 frame includes a five-bit parameter ("DIALNORM") indicating the DIALNORM value for the program. A five-bit parameter ("DIALNORM2") indicating the DIALNORM value for a second audio program carried in the same AC-3 frame is included if the audio coding mode ("acmod") of the AC-3 frame is "0", indicating that a dual-mono or "1+1" channel configuration is in use.

The BSI segment also includes a flag ("addbsie") indicating the presence (or absence) of additional bit stream information following the "addbsie" bit, a parameter ("addbsil") indicating the length of any additional bit stream information following the "addbsil" value, and up to 64 bits of additional bit stream information ("addbsi") following the "addbsil" value.

The BSI segment includes other metadata values not specifically shown in FIG. 6.

BRIEF DESCRIPTION OF THE INVENTION

In a class of embodiments, the invention is an audio processing unit that includes a buffer memory, an audio decoder, and a parser. The buffer memory stores at least one frame of an encoded audio bitstream. The encoded audio bitstream includes audio data and a metadata container. The metadata container includes a header, one or more metadata payloads, and protection data. The header includes a syncword identifying the start of the container. The one or more metadata payloads describe an audio program associated with the audio data. The protection data is located after the one or more metadata payloads. The protection data is also capable of being used to verify the integrity of the metadata container and the one or more payloads within the metadata container. The audio decoder is coupled to the buffer memory and is capable of decoding the audio data. The parser is coupled to or integrated with the audio decoder and capable of parsing the metadata container.

In typical embodiments, the method includes receiving an encoded audio bitstream where the encoded audio bitstream is segmented into one or more frames. The audio data is extracted from the encoded audio bitstream, along with a container of metadata. The container of metadata includes a header followed by one or more metadata payloads followed by protection data. Finally, the integrity of the container and the one or more metadata payloads is verified through the use of the protection data. The one or more metadata payloads may include a program loudness payload that contains data indicative of the measured loudness of an audio program associated with the audio data.

A payload of program loudness metadata, referred to as loudness processing state metadata ("LPSM"), embedded in an audio bitstream in accordance with typical embodiments of the invention may be authenticated and validated, e.g., to enable loudness regulatory entities to verify if a particular program's loudness is already within a specified range and that the corresponding audio data itself have not been modified (thereby ensuring compliance with applicable regulations). A loudness value included in a data block comprising the loudness processing state metadata may be read out to verify this, instead of computing the loudness again. In response to LPSM, a regulatory agency may determine that corresponding audio content is in compliance (as indicated by the LPSM) with loudness statutory and/or regulatory requirements (e.g., the regulations promulgated under the Commercial Advertisement Loudness Mitigation Act, also known as the "CALM" Act) without the need to compute loudness of the audio content.

Loudness measurements that are required for compliance with some loudness statutory and/or regulatory requirements (e.g., the regulations promulgated under the CALM Act) are based on integrated program loudness. Integrated program loudness requires that a loudness measurement, either of the dialog level or full-mix level, be made over an entire audio program. Thus, in order to make program loudness measurements (e.g., at various stages in the broadcast chain) to verify compliance with typical legal requirements, it is essential for the measurements to be made with knowledge of what audio data (and metadata) determine an entire audio program, and this typically requires knowledge of the location of the beginning and the end of the program (e.g., during processing of a bitstream indicative of a sequence of audio programs).

In accordance with typical embodiments of the present invention, an encoded audio bitstream is indicative of at least one audio program (e.g., a sequence of audio programs), and program boundary metadata and LPSM included in the bitstream enable resetting of program loudness measurement at the end of a program and thus provide an automated way of measuring integrated program loudness. Typical embodiments of the invention include program boundary metadata in an encoded audio bitstream in an efficient manner, which allows accurate and robust determination of at least one boundary between consecutive audio programs indicated by the bitstream. Typical embodiments allow accurate and robust determination of a program boundary in the sense that they allow accurate program boundary determination even in cases in which bitstreams indicative of different programs are spliced together (to generate the inventive bitstream) in a manner that truncates one or both of the spliced bitstreams (and thus discards program boundary metadata that had been included in at least one of the pre-splicing bitstreams).

In typical embodiments, the program boundary metadata in a frame of the inventive bitstream is a program boundary flag indicative of a frame count. Typically, the flag is indicative of the number of frames between the current frame (the frame which includes the flag) and a program boundary (the beginning or the end of the current audio program). In some preferred embodiments, program boundary flags are inserted in a symmetric, efficient manner at the beginning and end of each bitstream segment which is indicative of a single program (i.e., in frames occurring within some predetermined number of frames after the segment's beginning, and in frames occurring within some predetermined number of frames before the segment's end), so that when two such bitstream segments are concatenated (so as to be indicative of a sequence of two programs), the program boundary metadata can be present (e.g., symmetrically) on both sides of the boundary between the two programs.

To limit the data rate increase which results from including program boundary metadata in an encoded audio bitstream (which may be indicative of one audio program or a sequence of audio programs), in typical embodiments program boundary flags are inserted in only a subset of the frames of the bitstream. Typically, the boundary flag insertion rate is a non-increasing function of increasing separation of each of the bitstream's frames (in which a flag is inserted) from the program boundary which is nearest to said each of the frames, where "boundary flag insertion rate" denotes the average ratio of the number of frames (indicative of a program) which include a program boundary flag to the number of frames (indicative of the program) which do not include a program boundary flag, where the average is a running average over a number (e.g., relatively small number) of consecutive frames of the encoded audio bitstream. In a class of embodiments, the boundary flag insertion rate is a logarithmically decreasing function of increasing distance (of each flag insertion location) from the nearest program boundary, and for each flag-containing frame which includes one of the flags, the size of the flag in said flag-containing frame is equal to or greater than the size of each flag in a frame located closer to the nearest program boundary than is said flag-containing frame (i.e., the size of the program boundary flag in each flag-containing frame is a non-decreasing function of increasing separation of said flag-containing frame from the nearest program boundary).

Another aspect of the invention is an audio processing unit (APU) configured to perform any embodiment of the inventive method. In another class of embodiments, the invention is an APU including a buffer memory (buffer) which stores (e.g., in a non-transitory manner) at least one frame of an encoded audio bitstream which has been generated by any embodiment of the inventive method. Examples of APUs include, but are not limited to encoders (e.g., transcoders), decoders, codecs, pre-processing systems (pre-processors), post-processing systems (post-processors), audio bitstream processing systems, and combinations of such elements.

In another class of embodiments, the invention is an audio processing unit (APU) configured to generate an encoded audio bitstream comprising audio data segments and metadata segments, where the audio data segments are indicative of audio data, and each of at least some of the metadata segments includes loudness processing state metadata (LPSM) and optionally also program boundary metadata. Typically, at least one such metadata segment in a frame of the bitstream includes at least one segment of LPSM indicative of whether a first type of loudness processing has been performed on the audio data of the frame (i.e., audio data in at least one audio data segment of the frame), and at least one other segment of LPSM indicative of loudness of at least some of the audio data of the frame (e.g., dialog loudness of at least some of the audio data of the frame which are indicative of dialog). In one embodiment in this class, the APU is an encoder configured to encode input audio to generate encoded audio, and the audio data segments include the encoded audio. In typical embodiments in this class, each of the metadata segments has a preferred format to be described herein.

In some embodiments, each of the metadata segments of the encoded bitstream (an AC-3 bitstream or an E-AC-3 bitstream in some embodiments) which includes LPSM (e.g., LPSM and program boundary metadata) is included in a waste bit of skip field segment of a frame of the bitstream (e.g., a waste bit segment W of the type shown in FIG. 4 or FIG. 7). In other embodiments, each of the metadata segments of the encoded bitstream (an AC-3 bitstream or an E-AC-3 bitstream in some embodiments) which includes LPSM (e.g., LPSM and program boundary metadata) is included as additional bit stream information in the "addbsi" field of the Bitstream Information ("BSI") segment of a frame of the bitstream or in an auxdata field (e.g., an AUX segment of the type shown in FIG. 4 or FIG. 7) at the end of a frame of the bitstream. Each metadata segment including LPSM may have the format specified herein with reference to Tables 1 and 2 below (i.e., it includes the core elements specified in Table 1 or a variation thereon, followed by payload ID (identifying the metadata as LPSM) and payload size values, followed by the payload (LPSM data which has format as indicated in Table 2, or format as indicated in a variation on Table 2 described herein). In some embodiments, a frame may include one or two metadata segments, each of which includes LPSM, and if the frame includes two metadata segments, one may be present in the addbsi field of the frame and the other in the AUX field of the frame.

In a class of embodiments, the invention is a method including the steps of encoding audio data to generate an AC-3 or E-AC-3 encoded audio bitstream, including by including in a metadata segment (of at least one frame of the bitstream) LPSM and program boundary metadata and optionally also other metadata for the audio program to which the frame belongs. In some embodiments, each such metadata segment is included in an addbsi field of the frame, or an auxdata field of the frame. In other embodiments, each such metadata segment is included in a waste bit segment of the frame. In some embodiments, each metadata segment which contains LPSM and program boundary metadata contains a core header (and optionally also additional core elements), and after the core header (or the core header and other core elements) an LPSM payload (or container) segment having the following format:

a header, typically including at least one identification value (e.g., LPSM format version, length, period, count, and substream association values, as indicated in Table 2 set forth herein), and after the header, the LPSM and the program boundary metadata. The program boundary metadata may include a program boundary frame count, and a code value (e.g., an "offset_exist" value) indicative of whether the frame includes only a program boundary frame count or both a program boundary frame count and an offset value), and (in some cases) an offset value. The LPSM may include:

at least one dialog indication value indicating whether corresponding audio data indicates dialog or does not indicate dialog (e.g., which channels of corresponding audio data indicate dialog). The dialog indication value(s) may indicate whether dialog is present in any combination of, or all of, the channels of the corresponding audio data;

at least one loudness regulation compliance value indicating whether corresponding audio data complies with an indicated set of loudness regulations;

at least one loudness processing value indicating at least one type of loudness processing which has been performed on the corresponding audio data; and at least one loudness value indicating at least one loudness (e.g., peak or average loudness) characteristic of the corresponding audio data.

In other embodiments, the encoded bitstream is a bitstream which is not an AC-3 bitstream or an E-AC-3 bitstream, and each of the metadata segments which includes LPSM (and optionally also program boundary metadata) is included in a segment (or field or slot) of the bitstream reserved for storage of additional data. Each metadata segment including LPSM may have format similar or identical to that specified herein with reference to Tables 1 and 2 below (i.e., it includes core elements similar or identical to those specified in Table 1, followed by payload ID (identifying the metadata as LPSM) and payload size values, followed by the payload (LPSM data which has format similar or identical to the format indicated in Table 2 or a variation on Table 2 described herein).

In some embodiments, the encoded bitstream comprises a sequence of frames, each of the frames includes a Bitstream Information ("BSI") segment including an "addbsi" field (sometimes referred to as segment or slot), and an auxdata field or slot (e.g., the encoded bitstream is an AC-3 bitstream or an E-AC-3 bitstream), and comprises audio data segments (e.g., the AB0-AB5 segments of the frame shown in FIG. 4) and metadata segments, where the audio data segments are indicative of audio data, and each of at least some of the metadata segments includes loudness processing state metadata (LPSM) and optionally also program boundary metadata. The LPSM are present in the bitstream in the following format. Each of the metadata segments which includes LPSM is included in an "addbsi" field of the BSI segment of a frame of the bitstream, or in an auxdata field of a frame of the bitstream, or in a waste bit segment of a frame of the bitstream. Each metadata segment including LPSM includes an LPSM payload (or container) segment having the following format:

a header (typically including at least one identification value, e.g., the LPSM format version, length, period, count, and substream association values indicated in Table 2 below); and after the header, the LPSM and optionally also the program boundary metadata. The program boundary metadata may include a program boundary frame count, and a code value (e.g., an "offset_exist" value) indicative of whether the frame includes only a program boundary frame count or both a program boundary frame count and an offset value), and (in some cases) an offset value. The LPSM may include:

at least one dialog indication value (e.g., parameter "Dialog channel(s)" of Table 2) indicating whether corresponding audio data indicates dialog or does not indicate dialog (e.g., which channels of corresponding audio data indicate dialog). The dialog indication value(s) may indicate whether dialog is present in any combination of, or all of, the channels of the corresponding audio data;

at least one loudness regulation compliance value (e.g., parameter "Loudness Regulation Type" of Table 2) indicating whether corresponding audio data complies with an indicated set of loudness regulations;

at least one loudness processing value (e.g., one or more of parameters "Dialog gated Loudness Correction flag," "Loudness Correction Type," of Table 2) indicating at least one type of loudness processing which has been performed on the corresponding audio data; and at least one loudness value (e.g., one or more of parameters "ITU Relative Gated Loudness," "ITU Speech Gated Loudness," "ITU (EBU 3341) Short-term 3s Loudness," and "True Peak" of Table 2) indicating at least one loudness (e.g., peak or average loudness) characteristic of the corresponding audio data.

In any embodiment of the invention which contemplates, uses, or generates at least one loudness value indicative of corresponding audio data, the loudness value(s) may indicate at least one loudness measurement characteristic utilized to process the loudness and/or dynamic range of the audio data.

In some implementations, each of the metadata segments in an "addbsi" field, or an auxdata field, or a waste bit segment, of a frame of the bitstream has the following format:

a core header (typically including a syncword identifying the start of the metadata segment, followed by identification values, e.g., the Core element version, length, and period, extended element count, and substream association values indicated in Table 1 below); and after the core header, at least one protection value (e.g., an HMAC digest and Audio Fingerprint values, where the HMAC digest may be a 256-bit HMAC digest (using SHA-2 algorithm) computed over the audio data, the core element, and all expanded elements, of an entire frame, as indicated in Table 1) useful for at least one of decryption, authentication, or validation of at least one of loudness processing state metadata or the corresponding audio data); and also after the core header, if the metadata segment includes LPSM, LPSM payload identification ("ID") and LPSM payload size values which identify following metadata as an LPSM payload and indicate size of the LPSM payload. The LPSM payload segment (preferably having the above-specified format) follows the LPSM payload ID and LPSM payload size values.

In some embodiments of the type described in the previous paragraph, each of the metadata segments in the auxdata field (or "addbsi" field or waste bit segment) of the frame has three levels of structure:

a high level structure, including a flag indicating whether the auxdata (or addbsi) field includes metadata, at least one ID value indicating what type(s) of metadata are present, and typically also a value indicating how many bits of metadata (e.g., of each type) are present (if metadata is present). One type of metadata that could be present is LSPM, another type of metadata that could be present is program boundary metadata, and another type of metadata that could be present is media research metadata;

an intermediate level structure, comprising a core element for each identified type of metadata (e.g., core header, protection values, and payload ID and payload size values, e.g., of the type mentioned above, for each identified type of metadata); and a low level structure, comprising each payload for one core element (e.g., an LPSM payload, if one is identified by the core element as being present, and/or a metadata payload of another type, if one is identified by the core element as being present).

The data values in such a three level structure can be nested. For example, the protection value(s) for an LPSM payload and/or another metadata payload identified by a core element can be included after each payload identified by the core element (and thus after the core header of the core element). In one example, a core header could identify an LPSM payload and another metadata payload, payload ID and payload size values for the first payload (e.g., the LPSM payload) could follow the core header, the first payload itself could follow the ID and size values, the payload ID and payload size value for the second payload could follow the first payload, the second payload itself could follow these ID and size values, and protection value(s) for either or both of the payloads (or for core element values and either or both of the payloads) could follow the last payload.

In some embodiments, the core element of a metadata segment in an auxdata field (or "addbsi" field or waste bit segment) of a frame comprises a core header (typically including identification values, e.g., core element version), and after the core header: values indicative of whether fingerprint data is included for metadata of the metadata segment, values indicative of whether external data (related to audio data corresponding to the metadata of the metadata segment) exists, payload ID and payload size values for each type of metadata (e.g., LPSM, and/or metadata of a type other than LPSM) identified by the core element, and protection values for at least one type of metadata identified by the core element. The metadata payload(s) of the metadata segment follow the core header, and are (in some cases) nested within values of the core element.

In another preferred format, the encoded bitstream is a Dolby E bitstream, and each of the metadata segments which includes LPSM (and optionally also program boundary metadata) is included in the first N sample locations of the Dolby E guard band interval.

In another class of embodiments, the invention is an APU (e.g., a decoder) coupled and configured to receive an encoded audio bitstream comprising audio data segments and metadata segments, where the audio data segments are indicative of audio data, and each of at least some of the metadata segments includes loudness processing state metadata (LPSM) and optionally also program boundary metadata, and to extract the LPSM from the bitstream, to generate decoded audio data in response to the audio data and to perform at least one adaptive loudness processing operation on the audio data using the LPSM. Some embodiments in this class also include a post-processor coupled to the APU, wherein the post-processor is coupled and configured to perform at least one adaptive loudness processing operation on the audio data using the LPSM.

In another class of embodiments, the invention is an audio processing unit (APU) including a buffer memory (buffer) and a processing subsystem coupled to the buffer, wherein the APU is coupled to receive an encoded audio bitstream comprising audio data segments and metadata segments, where the audio data segments are indicative of audio data, and each of at least some of the metadata segments includes loudness processing state metadata (LPSM) and optionally also program boundary metadata, the buffer stores (e.g., in a non-transitory manner) at least one frame of the encoded audio bitstream, and the processing subsystem is configured to extract the LPSM from the bitstream and to perform at least one adaptive loudness processing operation on the audio data using the LPSM. In typical embodiments in this class, the APU is one of an encoder, a decoder, and a post-processor.

In some implementations of the inventive method, the audio bitstream generated is one of an AC-3 encoded bitstream, an E-AC-3 bitstream, or a Dolby E bitstream, including loudness processing state metadata, as well as other metadata (e.g., a DIALNORM metadata parameter, dynamic range control metadata parameters, and other metadata parameters). In some other implementations of the method, the audio bitstream generated is an encoded bitstream of another type.

Aspects of the invention include a system or device configured (e.g., programmed) to perform any embodiment of the inventive method, and a computer readable medium (e.g., a disc) which stores code (e.g., in a non-transitory manner) for implementing any embodiment of the inventive method or steps thereof. For example, the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and processing circuitry programmed (and/or otherwise configured) to perform an embodiment of the inventive method (or steps thereof) in response to data asserted thereto.

BRIEF DESCRIPTION OF THE DRAWINGS

FIG. 4 is a diagram of an AC-3 frame, including the segments into which it is divided.

FIG. 5 is a diagram of the Synchronization Information (SI) segment of an AC-3 frame, including segments into which it is divided.

FIG. 6 is a diagram of the Bitstream Information (BSI) segment of an AC-3 frame, including segments into which it is divided.

FIG. 7 is a diagram of an E-AC-3 frame, including segments into which it is divided.

FIG. 8 is a diagram of frames of an encoded audio bitstream which includes program boundary metadata whose format is in accordance with an embodiment of the invention.

FIG. 9 is a diagram of other frames of the encoded audio bitstream of FIG. 9. Some of these frames include program boundary metadata having format in accordance with an embodiment of the invention.

NOTATION AND NOMENCLATURE

Figure 1:
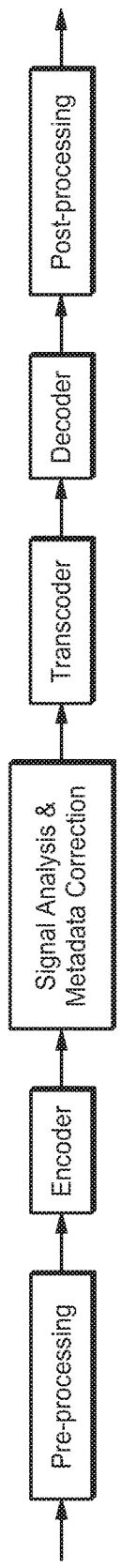
FIG. 1 is a block diagram of an embodiment of a system which may be configured to perform an embodiment of the inventive method.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X−M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the expressions "audio processor" and "audio processing unit" are used interchangeably, and in a broad sense, to denote a system configured to process audio data. Examples of audio processing units include, but are not limited to encoders (e.g., transcoders), decoders, codecs, pre-processing systems, post-processing systems, and bitstream processing systems (sometimes referred to as bitstream processing tools).

Throughout this disclosure including in the claims, the expression "processing state metadata" (e.g., as in the expression "loudness processing state metadata") refers to separate and different data from corresponding audio data (the audio content of an audio data stream which also includes processing state metadata). Processing state metadata is associated with audio data, indicates the loudness processing state of the corresponding audio data (e.g., what type(s) of processing have already been performed on the audio data), and typically also indicates at least one feature or characteristic of the audio data. The association of the processing state metadata with the audio data is time-synchronous. Thus, present (most recently received or updated) processing state metadata indicates that the corresponding audio data contemporaneously comprises the results of the indicated type(s) of audio data processing. In some cases, processing state metadata may include processing history and/or some or all of the parameters that are used in and/or derived from the indicated types of processing. Additionally, processing state metadata may include at least one feature or characteristic of the corresponding audio data, which has been computed or extracted from the audio data. Processing state metadata may also include other metadata that is not related to or derived from any processing of the corresponding audio data. For example, third party data, tracking information, identifiers, proprietary or standard information, user annotation data, user preference data, etc. may be added by a particular audio processing unit to pass on to other audio processing units.

Throughout this disclosure including in the claims, the expression "loudness processing state metadata" (or "LPSM") denotes processing state metadata indicative of the loudness processing state of corresponding audio data (e.g. what type(s) of loudness processing have been performed on the audio data) and typically also at least one feature or characteristic (e.g., loudness) of the corresponding audio data. Loudness processing state metadata may include data (e.g., other metadata) that is not (i.e., when it is considered alone) loudness processing state metadata.

Throughout this disclosure including in the claims, the expression "channel" (or "audio channel") denotes a monophonic audio signal.

Throughout this disclosure including in the claims, the expression "audio program" denotes a set of one or more audio channels and optionally also associated metadata (e.g., metadata that describes a desired spatial audio presentation, and/or LPSM, and/or program boundary metadata).

Throughout this disclosure including in the claims, the expression "program boundary metadata" denotes metadata of an encoded audio bitstream, where the encoded audio bitstream is indicative of at least one audio program (e.g., two or more audio programs), and the program boundary metadata is indicative of location in the bitstream of at least one boundary (beginning and/or end) of at least one said audio program. For example, the program boundary metadata (of an encoded audio bitstream indicative of an audio program) may include metadata indicative of the location (e.g., the start of the "N"th frame of the bitstream, or the "M"th sample location of the bitstream's "N"th frame) of the beginning of the program, and additional metadata indicative of the location (e.g., the start of the "J"th frame of the bitstream, or the "K"th sample location of the bitstream's "J"th frame) of the program's end.

Throughout this disclosure including in the claims, the term "couples" or "coupled" is used to mean either a direct or indirect connection. Thus, if a first device couples to a second device, that connection may be through a direct connection, or through an indirect connection via other devices and connections.

DETAILED DESCRIPTION OF EMBODIMENTS OF THE INVENTION

In accordance with typical embodiments of the invention, a payload of program loudness metadata, referred to as loudness processing state metadata ("LPSM") and optionally also program boundary metadata are embedded in one or more reserved fields (or slots) of metadata segments of an audio bitstream which also includes audio data in other segments (audio data segments). Typically, at least one segment of each frame of the bitstream includes LPSM, and at least one other segment of the frame includes corresponding audio data (i.e., audio data whose loudness processing state and loudness is indicated by the LPSM). In some embodiments, the data volume of the LPSM may be sufficiently small to be carried without affecting the bit rate allocated to carry the audio data.

Communicating loudness processing state metadata in an audio data processing chain is particularly useful when two or more audio processing units need to work in tandem with one another throughout the processing chain (or content lifecycle). Without inclusion of loudness processing state metadata in an audio bitstream, severe media processing problems such as quality, level and spatial degradations may occur, for example, when two or more audio codecs are utilized in the chain and single-ended volume leveling is applied more than once during bitstream's journey to a media consuming device (or a rendering point of the audio content of the bitstream).

FIG. 1 is a block diagram of an exemplary audio processing chain (an audio data processing system), in which one or more of the elements of the system may be configured in accordance with an embodiment of the present invention. The system includes the followings elements, coupled together as shown: a pre-processing unit, an encoder, a signal analysis and metadata correction unit, a transcoder, a decoder, and a pre-processing unit. In variations on the system shown, one or more of the elements are omitted, or additional audio data processing units are included.

In some implementations, the pre-processing unit of FIG. 1 is configured to accept PCM (time-domain) samples comprising audio content as input, and to output processed PCM samples. The encoder may be configured to accept the PCM samples as input and to output an encoded (e.g., compressed) audio bitstream indicative of the audio content. The data of the bitstream that are indicative of the audio content are sometimes referred to herein as "audio data." If the encoder is configured in accordance with a typical embodiment of the present invention, the audio bitstream output from the encoder includes loudness processing state metadata (and typically also other metadata, optionally including program boundary metadata) as well as audio data.

The signal analysis and metadata correction unit of FIG. 1 may accept one or more encoded audio bitstreams as input and determine (e.g., validate) whether processing state metadata in each encoded audio bitstream is correct, by performing signal analysis (e.g., using program boundary metadata in an encoded audio bitstream). If the signal analysis and metadata correction unit finds that included metadata is invalid, it typically replaces the incorrect value(s) with the correct value(s) obtained from signal analysis. Thus, each encoded audio bitstream output from the signal analysis and metadata correction unit may include corrected (or uncorrected) processing state metadata as well as encoded audio data.

The transcoder of FIG. 1 may accept encoded audio bitstreams as input, and output modified (e.g., differently encoded) audio bitstreams in response (e.g., by decoding an input stream and re-encoding the decoded stream in a different encoding format). If the transcoder is configured in accordance with a typical embodiment of the present invention, the audio bitstream output from the transcoder includes loudness processing state metadata (and typically also other metadata) as well as encoded audio data. The metadata may have been included in the bitstream.

The decoder of FIG. 1 may accept encoded (e.g., compressed) audio bitstreams as input, and output (in response) streams of decoded PCM audio samples. If the decoder is configured in accordance with a typical embodiment of the present invention, the output of the decoder in typical operation is or includes any of the following:

- a stream of audio samples, and a corresponding stream of loudness processing state metadata (and typically also other metadata) extracted from an input encoded bitstream; or
- a stream of audio samples, and a corresponding stream of control bits determined from loudness processing state metadata (and typically also other metadata) extracted from an input encoded bitstream; or
- a stream of audio samples, without a corresponding stream of processing state metadata or control bits determined from processing state metadata. In this last case, the decoder may extract loudness processing state metadata (and/or other metadata) from the input encoded bitstream and perform it least one operation on the extracted metadata (e.g., validation), even though it does not output the extracted metadata or control bits determined therefrom.

By configuring the post-processing unit of FIG. 1 in accordance with a typical embodiment of the present invention, the post-processing unit is configured to accept a stream of decoded PCM audio samples, and to perform post processing thereon (e.g., volume leveling of the audio content) using loudness processing state metadata (and typically also other metadata) received with the samples, or control bits (determined by the decoder from loudness processing state metadata and typically also other metadata) received with the samples. The post-processing unit is typically also configured to render the post-processed audio content for playback by one or more speakers.

Typical embodiments of the present invention provide an enhanced audio processing chain in which audio processing units (e.g., encoders, decoders, transcoders, and pre- and post-processing units) adapt their respective processing to be applied to audio data according to a contemporaneous state of the media data as indicated by loudness processing state metadata respectively received by the audio processing units.

The audio data input to any audio processing unit of the FIG. 1 system (e.g., the encoder or transcoder of FIG. 1) may include loudness processing state metadata (and optionally also other metadata) as well as audio data (e.g., encoded audio data). This metadata may have been included in the input audio by another element of the FIG. 1 system (or another source, not shown in FIG. 1) in accordance with an embodiment of the present invention. The processing unit which receives the input audio (with metadata) may be configured to perform it least one operation on the metadata (e.g., validation) or in response to the metadata (e.g., adaptive processing of the input audio), and typically also to include in its output audio the metadata, a processed version of the metadata, or control bits determined from the metadata.

A typical embodiment of the inventive audio processing unit (or audio processor) is configured to perform adaptive processing of audio data based on the state of the audio data as indicated by loudness processing state metadata corresponding to the audio data. In some embodiments, the adaptive processing is (or includes) loudness processing (if the metadata indicates that the loudness processing, or processing similar thereto, has not already been performed on the audio data, but is not (and does not include) loudness processing (if the metadata indicates that such loudness processing, or processing similar thereto, has already been performed on the audio data). In some embodiments, the adaptive processing is or includes metadata validation (e.g., performed in a metadata validation sub-unit) to ensure the audio processing unit performs other adaptive processing of the audio data based on the state of the audio data as indicated by the loudness processing state metadata. In some embodiments, the validation determines reliability of the loudness processing state metadata associated with (e.g., included in a bitstream with) the audio data. For example, if the metadata is validated to be reliable, then results from a type of previously performed audio processing may be re-used and new performance of the same type of audio processing may be avoided. On the other hand, if the metadata is found to have been tampered with (or otherwise unreliable), then the type of media processing purportedly previously performed (as indicated by the unreliable metadata) may be repeated by the audio processing unit, and/or other processing may be performed by the audio processing unit on the metadata and/or the audio data. The audio processing unit may also be configured to signal to other audio processing units downstream in an enhanced media processing chain that loudness processing state metadata (e.g., present in a media bitstream) is valid, if the unit determines that the processing state metadata is valid (e.g., based on a match of a cryptographic value extracted and a reference cryptographic value).

Figure 2:
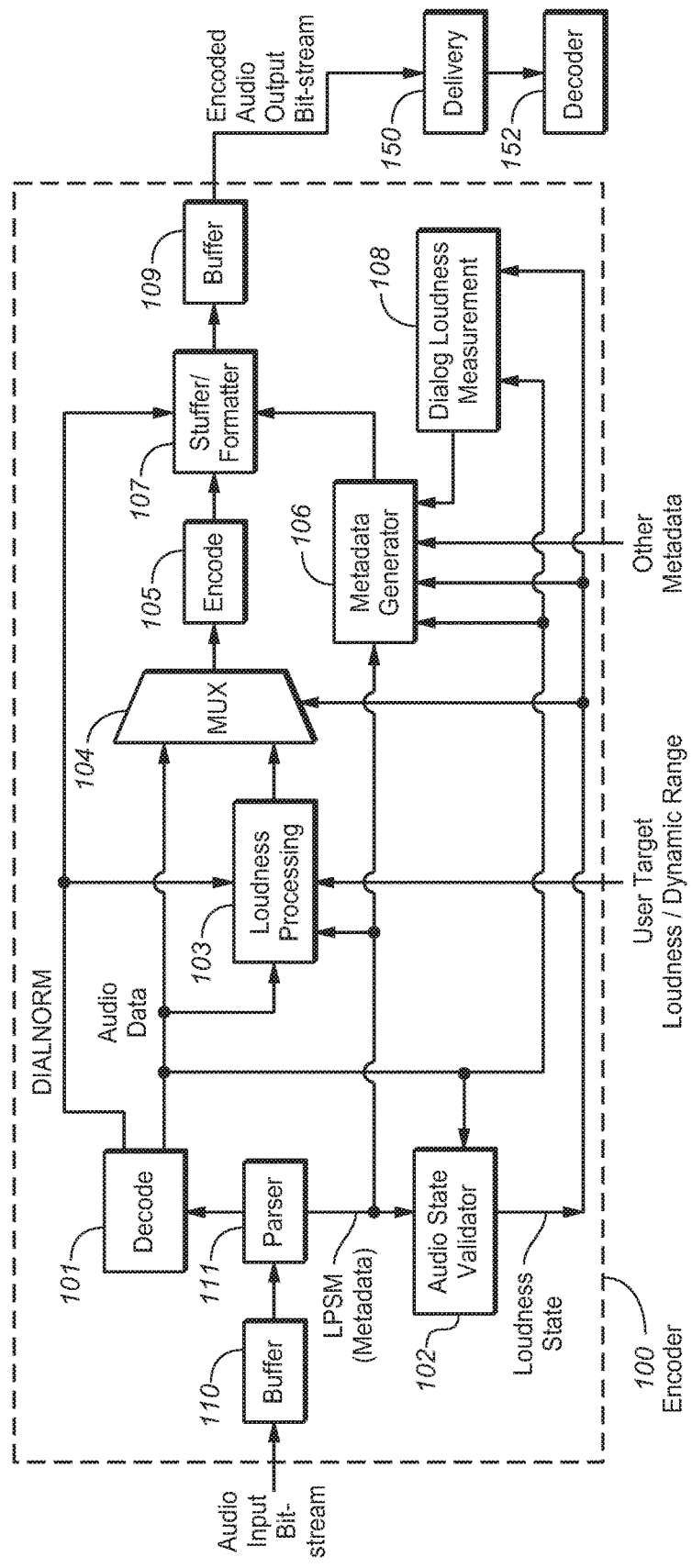
FIG. 2 is a block diagram of an encoder which is an embodiment of the inventive audio processing unit.

FIG. 2 is a block diagram of an encoder (100) which is an embodiment of the inventive audio processing unit. Any of the components or elements of encoder 100 may be implemented as one or more processes and/or one or more circuits (e.g., ASICs, FPGAs, or other integrated circuits), in hardware, software, or a combination of hardware and software. Encoder 100 comprises frame buffer 110, parser 111, decoder 101, audio state validator 102, loudness processing stage 103, audio stream selection stage 104, encoder 105, stuffer/formatter stage 107, metadata generation stage 106, dialog loudness measurement subsystem 108, and frame buffer 109, connected as shown. Typically also, encoder 100 includes other processing elements (not shown).

Encoder 100 (which is a transcoder) is configured to convert an input audio bitstream (which, for example, may be one of an AC-3 bitstream, an E-AC-3 bitstream, or a Dolby E bitstream) to an encoded output audio bitstream (which, for example, may be another one of an AC-3 bitstream, an E-AC-3 bitstream, or a Dolby E bitstream) including by performing adaptive and automated loudness processing using loudness processing state metadata included in the input bitstream. For example, encoder 100 may be configured to convert an input Dolby E bitstream (a format typically used in production and broadcast facilities but not in consumer devices which receive audio programs which have been broadcast thereto) to an encoded output audio bitstream (suitable for broadcasting to consumer devices) in AC-3 or E-AC-3 format.

The system of FIG. 2 also includes encoded audio delivery subsystem 150 (which stores and/or delivers the encoded bitstreams output from encoder 100) and decoder 152. An encoded audio bitstream output from encoder 100 may be stored by subsystem 150 (e.g., in the form of a DVD or Blu ray disc), or transmitted by subsystem 150 (which may implement a transmission link or network), or may be both stored and transmitted by subsystem 150. Decoder 152 is configured to decode an encoded audio bitstream (generated by encoder 100) which it receives via subsystem 150, including by extracting loudness processing state metadata (LPSM) from each frame of the bitstream (and optionally also extracting program boundary metadata from the bitstream), and generating decoded audio data. Typically, decoder 152 is configured to perform adaptive loudness processing on the decoded audio data using the LPSM (and optionally also program boundary metadata), and/or to forward the decoded audio data and LPSM to a post-processor configured to perform adaptive loudness processing on the decoded audio data using the LPSM (and optionally also program boundary metadata). Typically, decoder 152 includes a buffer which stores (e.g., in a non-transitory manner) the encoded audio bitstream received from subsystem 150.

Various implementations of encoder 100 and decoder 152 are configured to perform different embodiments of the inventive method. Frame buffer 110 is a buffer memory coupled to receive an encoded input audio bitstream. In operation, buffer 110 stores (e.g., in a non-transitory manner) at least one frame of the encoded audio bitstream, and a sequence of the frames of the encoded audio bitstream is asserted from buffer 110 to parser 111.

Parser 111 is coupled and configured to extract loudness processing state metadata (LPSM), and optionally also program boundary metadata (and/or other metadata) from each frame of the encoded input audio in which such metadata is included, to assert at least the LPSM (and optionally also program boundary metadata and/or other metadata) to audio state validator 102, loudness processing stage 103, stage 106 and subsystem 108, to extract audio data from the encoded input audio, and to assert the audio data to decoder 101. Decoder 101 of encoder 100 is configured to decode the audio data to generate decoded audio data, and to assert the decoded audio data to loudness processing stage 103, audio stream selection stage 104, subsystem 108, and typically also to state validator 102.

State validator 102 is configured to authenticate and validate the LPSM (and optionally other metadata) asserted thereto. In some embodiments, the LPSM is (or is included in) a data block that has been included in the input bitstream (e.g., in accordance with an embodiment of the present invention). The block may comprise a cryptographic hash (a hash-based message authentication code or "HMAC") for processing the LPSM (and optionally also other metadata) and/or the underlying audio data (provided from decoder 101 to validator 102). The data block may be digitally signed in these embodiments, so that a downstream audio processing unit may relatively easily authenticate and validate the processing state metadata.

For example, the HMAC is used to generate a digest, and the protection value(s) included in the inventive bitstream may include the digest. The digest may be generated as follows for an AC-3 frame:

1. After AC-3 data and LPSM are encoded, frame data bytes (concatenated frame_data #1 and frame_data #2) and the LPSM data bytes are used as input for the hashing-function HMAC. Other data, which may be present inside an auxdata field, are not taken into consideration for calculating the digest. Such other data may be bytes neither belonging to the AC-3 data nor to the LSPSM data. Protection bits included in LPSM may not be considered for calculating the HMAC digest.
2. After the digest is calculated, it is written into the bitstream in a field reserved for protection bits.
3. The last step of the generation of the complete AC-3 frame is the calculation of the CRC-check. This is written at the very end of the frame and all data belonging to this frame is taken into consideration, including the LPSM bits.

Other cryptographic methods including but not limited to any of one or more non-HMAC cryptographic methods may be used for validation of LPSM (e.g., in validator 102) to ensure secure transmission and receipt of the LPSM and/or the underlying audio data. For example, validation (using such a cryptographic method) can be performed in each audio processing unit which receives an embodiment of the inventive audio bitstream to determine whether the loudness processing state metadata and corresponding audio data included in the bitstream have undergone (and/or have resulted from) specific loudness processing (as indicated by the metadata) and have not been modified after performance of such specific loudness processing.

State validator 102 asserts control data to audio stream selection stage 104, metadata generator 106, and dialog loudness measurement subsystem 108, to indicate the results of the validation operation. In response to the control data, stage 104 may select (and pass through to encoder 105) either:

the adaptively processed output of loudness processing stage 103 (e.g., when the LPSM indicate that the audio data output from decoder 101 have not undergone a specific type of loudness processing, and the control bits from validator 102 indicate that the LPSM are valid); or the audio data output from decoder 101 (e.g., when the LPSM indicate that the audio data output from decoder 101 have already undergone the specific type of loudness processing that would be performed by stage 103, and the control bits from validator 102 indicate that the LPSM are valid).

Stage 103 of encoder 100 is configured to perform adaptive loudness processing on the decoded audio data output from decoder 101, based on one or more audio data characteristics indicated by LPSM extracted by decoder 101. Stage 103 may be an adaptive transform-domain real time loudness and dynamic range control processor. Stage 103 may receive user input (e.g., user target loudness/dynamic range values or dialnorm values), or other metadata input (e.g., one or more types of third party data, tracking information, identifiers, proprietary or standard information, user annotation data, user preference data, etc.) and/or other input (e.g., from a fingerprinting process), and use such input to process the decoded audio data output from decoder 101. Stage 103 may perform adaptive loudness processing on decoded audio data (output from decoder 101) indicative of a single audio program (as indicated by program boundary metadata extracted by parser 111), and may reset the loudness processing in response to receiving decoded audio data (output from decoder 101) indicative of a different audio program as indicated by program boundary metadata extracted by parser 111.

Dialog loudness measurement subsystem 108 may operate to determine loudness of segments of the decoded audio (from decoder 101) which are indicative of dialog (or other speech), e.g., using the LPSM (and/or other metadata) extracted by decoder 101, when the control bits from validator 102 indicate that the LPSM are invalid. Operation of dialog loudness measurement subsystem 108 may be disabled when the LPSM indicate previously determined loudness of dialog (or other speech) segments of the decoded audio (from decoder 101) when the control bits from validator 102 indicate that the LPSM are valid. Subsystem 108 may perform a loudness measurement on decoded audio data indicative of a single audio program (as indicated by program boundary metadata extracted by parser 111), and may reset the measurement in response to receiving decoded audio data indicative of a different audio program as indicated by such program boundary metadata.

Useful tools (e.g., the Dolby LM100 loudness meter) exist for measuring the level of dialog in audio content conveniently and easily. Some embodiments of the inventive APU (e.g., stage 108 of encoder 100) are implemented to include (or to perform the functions of) such a tool to measure the mean dialog loudness of audio content of an audio bitstream (e.g., a decoded AC-3 bitstream asserted to stage 108 from decoder 101 of encoder 100).

If stage 108 is implemented to measure the true mean dialog loudness of audio data, the measurement may include a step of isolating segments of the audio content that predominantly contain speech. The audio segments that predominantly are speech are then processed in accordance with a loudness measurement algorithm. For audio data decoded from an AC-3 bitstream, this algorithm may be a standard K-weighted loudness measure (in accordance with the international standard ITU-R BS.1770). Alternatively, other loudness measures may be used (e.g., those based on psychoacoustic models of loudness).

The isolation of speech segments is not essential to measure the mean dialog loudness of audio data. However, it improves the accuracy of the measure and typically provides more satisfactory results from a listener's perspective. Because not all audio content contains dialog (speech), the loudness measure of the whole audio content may provide a sufficient approximation of the dialog level of the audio, had speech been present.

Metadata generator 106 generates (and/or passes through to stage 107) metadata to be included by stage 107 in the encoded bitstream to be output from encoder 100. Metadata generator 106 may pass through to stage 107 the LPSM (and optionally also program boundary metadata and/or other metadata) extracted by encoder 101 and/or parser 111 (e.g., when control bits from validator 102 indicate that the LPSM and/or other metadata are valid), or generate new LPSM (and optionally also program boundary metadata and/or other metadata) and assert the new metadata to stage 107 (e.g., when control bits from validator 102 indicate that the LPSM and/or other metadata extracted by decoder 101 are invalid, or it may assert to stage 107 a combination of metadata extracted by decoder 101 and/or parser 111 and newly generated metadata. Metadata generator 106 may include loudness data generated by subsystem 108, and at least one value indicative of the type of loudness processing performed by subsystem 108, in the LPSM it asserts to stage 107 for inclusion in the encoded bitstream to be output from encoder 100.

Metadata generator 106 may generate protection bits (which may consist of or include a hash-based message authentication code or "HMAC") useful for at least one of decryption, authentication, or validation of the LPSM (and optionally also other metadata) to be included in the encoded bitstream and/or the underlying audio data to be included in the encoded bitstream. Metadata generator 106 may provide such protection bits to stage 107 for inclusion in the encoded bitstream.

In typical operation, dialog loudness measurement subsystem 108 processes the audio data output from decoder 101 to generate in response thereto loudness values (e.g., gated and ungated dialog loudness values) and dynamic range values. In response to these values, metadata generator 106 may generate loudness processing state metadata (LPSM) for inclusion (by stuffer/formatter 107) into the encoded bitstream to be output from encoder 100.

Additionally, optionally, or alternatively, subsystems of 106 and/or 108 of encoder 100 may perform additional analysis of the audio data to generate metadata indicative of at least one characteristic of the audio data for inclusion in the encoded bitstream to be output from stage 107.

Encoder 105 encodes (e.g., by performing compression thereon) the audio data output from selection stage 104, and asserts the encoded audio to stage 107 for inclusion in the encoded bitstream to be output from stage 107.

Stage 107 multiplexes the encoded audio from encoder 105 and the metadata (including LPSM) from generator 106 to generate the encoded bitstream to be output from stage 107, preferably so that the encoded bitstream has format as specified by a preferred embodiment of the present invention.

Frame buffer 109 is a buffer memory which stores (e.g., in a non-transitory manner) at least one frame of the encoded audio bitstream output from stage 107, and a sequence of the frames of the encoded audio bitstream is then asserted from buffer 109 as output from encoder 100 to delivery system 150.

The LPSM generated by metadata generator 106 and included in the encoded bitstream by stage 107 is indicative of the loudness processing state of corresponding audio data (e.g., what type(s) of loudness processing have been performed on the audio data) and loudness (e.g., measured dialog loudness, gated and/or ungated loudness, and/or dynamic range) of the corresponding audio data.

Herein, "gating" of loudness and/or level measurements performed on audio data refers to a specific level or loudness threshold where computed value(s) that exceed the threshold are included in the final measurement (e.g., ignoring short term loudness values below −60 dBFS in the final measured values). Gating on an absolute value refers to a fixed level or loudness, whereas gating on a relative value refers to a value that is dependent on a current "ungated" measurement value.

In some implementations of encoder 100, the encoded bitstream buffered in memory 109 (and output to delivery system 150) is an AC-3 bitstream or an E-AC-3 bitstream, and comprises audio data segments (e.g., the AB0-AB5 segments of the frame shown in FIG. 4) and metadata segments, where the audio data segments are indicative of audio data, and each of at least some of the metadata segments includes loudness processing state metadata (LPSM). Stage 107 inserts LPSM (and optionally also program boundary metadata) into the bitstream in the following format. Each of the metadata segments which includes LPSM (and optionally also program boundary metadata) is included in a waste bit segment of the bitstream (e.g., a waste bit segment "W" as shown in FIG. 4 or FIG. 7), or an "addbsi" field of the Bitstream Information ("BSI") segment of a frame of the bitstream, or in an auxdata field (e.g., the AUX segment shown in FIG. 4 or FIG. 7) at the end of a frame of the bitstream. A frame of the bitstream may include one or two metadata segments, each of which includes LPSM, and if the frame includes two metadata segments, one may be present in the addbsi field of the frame and the other in the AUX field of the frame. In some embodiments, each metadata segment including LPSM includes an LPSM payload (or container) segment having the following format:

- a header (typically including a syncword identifying the start of the LPSM payload, followed by at least one identification value, e.g., the LPSM format version, length, period, count, and substream association values indicated in Table 2 below); and after the header,

- at least one dialog indication value (e.g., parameter "Dialog channel(s)" of Table 2) indicating whether corresponding audio data indicates dialog or does not indicate dialog (e.g., which channels of corresponding audio data indicate dialog);
- at least one loudness regulation compliance value (e.g., parameter "Loudness Regulation Type" of Table 2) indicating whether corresponding audio data complies with an indicated set of loudness regulations;
- at least one loudness processing value (e.g., one or more of parameters "Dialog gated Loudness Correction flag," "Loudness Correction Type," of Table 2) indicating at least one type of loudness processing which has been performed on the corresponding audio data; and
- at least one loudness value (e.g., one or more of parameters "ITU Relative Gated Loudness," "ITU Speech Gated Loudness," "ITU (EBU 3341) Short-term 3s Loudness," and "True Peak" of Table 2) indicating at least one loudness (e.g., peak or average loudness) characteristic of the corresponding audio data.

In some embodiments, each metadata segment which contains LPSM and program boundary metadata contains a core header (and optionally also additional core elements), and after the core header (or the core header and other core elements) an LPSM payload (or container) segment having the following format:

- a header, typically including at least one identification value (e.g., LPSM format version, length, period, count, and substream association values, as indicated in Table 2 set forth herein), and after the header, the LPSM and the program boundary metadata. The program boundary metadata may include a program boundary frame count, and a code value (e.g., an "offset_exist" value) indicative of whether the frame includes only a program boundary frame count or both a program boundary frame count and an offset value), and (in some cases) an offset value.

In some implementations, each of the metadata segments inserted by stage 107 into a waste bit segment or an "addbsi" field or an auxdata field of a frame of the bitstream has the following format:

a core header (typically including a syncword identifying the start of the metadata segment, followed by identification values, e.g., the Core element version, length, and period, extended element count, and substream association values indicated in Table 1 below); and after the core header, at least one protection value (e.g., the HMAC digest and Audio Fingerprint values of Table 1) useful for at least one of decryption, authentication, or validation of at least one of loudness processing state metadata or the corresponding audio data); and also after the core header, if the metadata segment includes LPSM, LPSM payload identification ("ID") and LPSM payload size values which identify following metadata as an LPSM payload and indicate size of the LPSM payload.

The LPSM payload (or container) segment (preferably having the above-specified format) follows the LPSM payload ID and LPSM payload size values.

In some embodiments, each of the metadata segments in the auxdata field (or "addbsi" field) of a frame has three levels of structure:

a high level structure, including a flag indicating whether the auxdata (or addbsi) field includes metadata, at least one ID value indicating what type(s) of metadata are present, and typically also a value indicating how many bits of metadata (e.g., of each type) are present (if metadata is present). One type of metadata that could be present is LSPM, another type of metadata that could be present is program boundary metadata, and another type of metadata that could be present is media research metadata (e.g., Nielsen Media Research metadata);

an intermediate level structure, comprising a core element for each identified type of metadata (e.g., core header, protection values, and LPSM payload ID and LPSM payload size values, as mentioned above, for each identified type of metadata); and a low level structure, comprising each payload for one core element (e.g., an LPSM payload, if one is identified by the core element as being present, and/or a metadata payload of another type, if one is identified by the core element as being present).

The data values in such a three level structure can be nested. For example, the protection value(s) for an LPSM payload and/or another metadata payload identified by a core element can be included after each payload identified by the core element (and thus after the core header of the core element). In one example, a core header could identify an LPSM payload and another metadata payload, payload ID and payload size values for the first payload (e.g., the LPSM payload) could follow the core header, the first payload itself could follow the ID and size values, the payload ID and payload size value for the second payload could follow the first payload, the second payload itself could follow these ID and size values, and protection bits for both payloads (or for core element values and both payloads) could follow the last payload.

In some embodiments, if decoder 101 receives an audio bitstream generated in accordance with an embodiment of the invention with cryptographic hash, the decoder is configured to parse and retrieve the cryptographic hash from a data block determined from the bitstream, said block comprising loudness processing state metadata (LPSM) and optionally also program boundary metadata. Validator 102 may use the cryptographic hash to validate the received bitstream and/or associated metadata. For example, if validator 102 finds the LPSM to be valid based on a match between a reference cryptographic hash and the cryptographic hash retrieved from the data block, then it may disable operation of processor 103 on the corresponding audio data and cause selection stage 104 to pass through (unchanged) the audio data. Additionally, optionally, or alternatively, other types of cryptographic techniques may be used in place of a method based on a cryptographic hash.

Encoder 100 of FIG. 2 may determine (in response to LPSM, and optionally also program boundary metadata, extracted by decoder 101) that a post/pre-processing unit has performed a type of loudness processing on the audio data to be encoded (in elements 105, 106, and 107) and hence may create (in generator 106) loudness processing state metadata that includes the specific parameters used in and/or derived from the previously performed loudness processing. In some implementations, encoder 100 may create (and include in the encoded bitstream output therefrom) processing state metadata indicative of processing history on the audio content so long as the encoder is aware of the types of processing that have been performed on the audio content.

Figure 3:
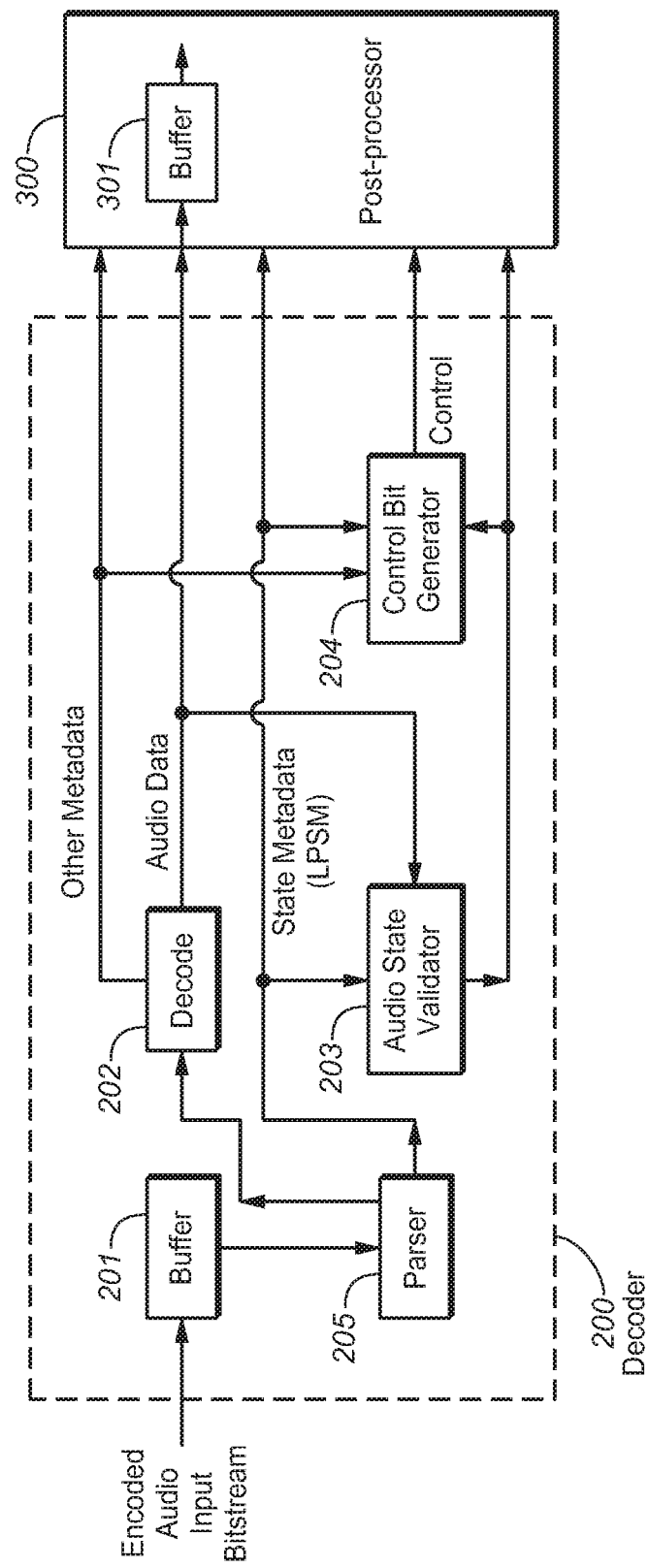
FIG. 3 is a block diagram of a decoder which is an embodiment of the inventive audio processing unit, and a post-processor coupled thereto which is another embodiment of the inventive audio processing unit.

FIG. 3 is a block diagram of a decoder (200) which is an embodiment of the inventive audio processing unit, and of a post-processor (300) coupled thereto. Post-processor (300) is also an embodiment of the inventive audio processing unit. Any of the components or elements of decoder 200 and post-processor 300 may be implemented as one or more processes and/or one or more circuits (e.g., ASICs, FPGAs, or other integrated circuits), in hardware, software, or a combination of hardware and software. Decoder 200 comprises frame buffer 201, parser 205, audio decoder 202, audio state validation stage (validator) 203, and control bit generation stage 204, connected as shown. Typically also, decoder 200 includes other processing elements (not shown).

Frame buffer 201 (a buffer memory) stores (e.g., in a non-transitory manner) at least one frame of the encoded audio bitstream received by decoder 200. A sequence of the frames of the encoded audio bitstream is asserted from buffer 201 to parser 205.

Parser 205 is coupled and configured to extract loudness processing state metadata (LPSM) and optionally also program boundary metadata, and other metadata from each frame of the encoded input audio, to assert at least the LPSM (and program boundary metadata if any is extracted) to audio state validator 203 and stage 204, to assert the LPSM (and optionally also program boundary metadata) as output (e.g., to post-processor 300), to extract audio data from the encoded input audio, and to assert the extracted audio data to decoder 202.

The encoded audio bitstream input to decoder 200 may be one of an AC-3 bitstream, an E-AC-3 bitstream, or a Dolby E bitstream.

The system of FIG. 3 also includes post-processor 300. Post-processor 300 comprises frame buffer 301 and other processing elements (not shown) including at least one processing element coupled to buffer 301. Frame buffer 301 stores (e.g., in a non-transitory manner) at least one frame of the decoded audio bitstream received by post-processor 300 from decoder 200. Processing elements of post-processor 300 are coupled and configured to receive and adaptively process a sequence of the frames of the decoded audio bitstream output from buffer 301, using metadata (including LPSM values) output from decoder 202 and/or control bits output from stage 204 of decoder 200. Typically, post-processor 300 is configured to perform adaptive loudness processing on the decoded audio data using the LPSM values and optionally also program boundary metadata (e.g., based on loudness processing state, and/or one or more audio data characteristics, indicated by LPSM for audio data indicative of a single audio program).

Various implementations of decoder 200 and post-processor 300 are configured to perform different embodiments of the inventive method.

Audio decoder 202 of decoder 200 is configured to decode the audio data extracted by parser 205 to generate decoded audio data, and to assert the decoded audio data as output (e.g., to post-processor 300).

State validator 203 is configured to authenticate and validate the LPSM (and optionally other metadata) asserted thereto. In some embodiments, the LPSM is (or is included in) a data block that has been included in the input bitstream (e.g., in accordance with an embodiment of the present invention). The block may comprise a cryptographic hash (a hash-based message authentication code or "HMAC") for processing the LPSM (and optionally also other metadata) and/or the underlying audio data (provided from parser 205 and/or decoder 202 to validator 203). The data block may be digitally signed in these embodiments, so that a downstream audio processing unit may relatively easily authenticate and validate the processing state metadata.

Other cryptographic methods including but not limited to any of one or more non-HMAC cryptographic methods may be used for validation of LPSM (e.g., in validator 203) to ensure secure transmission and receipt of the LPSM and/or the underlying audio data. For example, validation (using such a cryptographic method) can be performed in each audio processing unit which receives an embodiment of the inventive audio bitstream to determine whether the loudness processing state metadata and corresponding audio data included in the bitstream have undergone (and/or have resulted from) specific loudness processing (as indicated by the metadata) and have not been modified after performance of such specific loudness processing.

State validator 203 asserts control data to control bit generator 204, and/or asserts the control data as output (e.g., to post-processor 300), to indicate the results of the validation operation. In response to the control data (and optionally also other metadata extracted from the input bitstream), stage 204 may generate (and assert to post-processor 300) either:

control bits indicating that decoded audio data output from decoder 202 have undergone a specific type of loudness processing (when the LPSM indicate that the audio data output from decoder 202 have undergone the specific type of loudness processing, and the control bits from validator 203 indicate that the LPSM are valid); or control bits indicating that decoded audio data output from decoder 202 should undergo a specific type of loudness processing (e.g., when the LPSM indicate that the audio data output from decoder 202 have not undergone the specific type of loudness processing, or when the LPSM indicate that the audio data output from decoder 202 have undergone the specific type of loudness processing but the control bits from validator 203 indicate that the LPSM are not valid).

Alternatively, decoder 200 asserts the metadata extracted by decoder 202 from the input bitstream, and the LPSM (and optionally also program boundary metadata) extracted by parser 205 from the input bitstream to post-processor 300, and post-processor 300 performs loudness processing on the decoded audio data using the LPSM (and optionally also the program boundary metadata), or performs validation of the LPSM and then performs loudness processing on the decoded audio data using the LPSM (and optionally also program boundary metadata) if the validation indicates that the LPSM are valid.

In some embodiments, if decoder 200 receives an audio bitstream generated in accordance with an embodiment of the invention with cryptographic hash, the decoder is configured to parse and retrieve the cryptographic hash from a data block determined from the bitstream, said block comprising loudness processing state metadata (LPSM). Validator 203 may use the cryptographic hash to validate the received bitstream and/or associated metadata. For example, if validator 203 finds the LPSM to be valid based on a match between a reference cryptographic hash and the cryptographic hash retrieved from the data block, then it may signal to a downstream audio processing unit (e.g., post-processor 300, which may be or include a volume leveling unit) to pass through (unchanged) the audio data of the bitstream. Additionally, optionally, or alternatively, other types of cryptographic techniques may be used in place of a method based on a cryptographic hash.

In some implementations of decoder 200, the encoded bitstream received (and buffered in memory 201) is an AC-3 bitstream or an E-AC-3 bitstream, and comprises audio data segments (e.g., the AB0-AB5 segments of the frame shown in FIG. 4) and metadata segments, where the audio data segments are indicative of audio data, and each of at least some of the metadata segments includes loudness processing state metadata (LPSM) and optionally also program boundary metadata. Decoder stage 202 (and/or parser 205) is configured to extract from the bitstream LPSM (and optionally also program boundary metadata) having the following format. Each of the metadata segments which includes LPSM (and optionally also program boundary metadata) is included in a waste bit segment of a frame of the bitstream, or an "addbsi" field of the Bitstream Information ("BSI") segment of a frame of the bitstream, or in an auxdata field (e.g., the AUX segment shown in FIG. 4) at the end of a frame of the bitstream. A frame of the bitstream may include one or two metadata segments, each of which may include LPSM, and if the frame includes two metadata segments, one may be present in the addbsi field of the frame and the other in the AUX field of the frame. In some embodiments, each metadata segment including LPSM includes an LPSM payload (or container) segment having the following format:

a header (typically including a syncword identifying the start of the LPSM payload, followed by identification values, e.g., the LPSM format version, length, period, count, and substream association values indicated in Table 2 below); and after the header, at least one dialog indication value (e.g., parameter "Dialog channel(s)" of Table 2) indicating whether corresponding audio data indicates dialog or does not indicate dialog (e.g., which channels of corresponding audio data indicate dialog);

at least one loudness regulation compliance value (e.g., parameter "Loudness Regulation Type" of Table 2) indicating whether corresponding audio data complies with an indicated set of loudness regulations;

at least one loudness processing value (e.g., one or more of parameters "Dialog gated Loudness Correction flag," "Loudness Correction Type," of Table 2) indicating at least one type of loudness processing which has been performed on the corresponding audio data; and at least one loudness value (e.g., one or more of parameters "ITU Relative Gated Loudness," "ITU Speech Gated Loudness," "ITU (EBU 3341) Short-term 3s Loudness," and "True Peak" of Table 2) indicating at least one loudness (e.g., peak or average loudness) characteristic of the corresponding audio data.

In some embodiments, each metadata segment which contains LPSM and program boundary metadata contains a core header (and optionally also additional core elements), and after the core header (or the core header and other core elements) an LPSM payload (or container) segment having the following format:

a header, typically including at least one identification value (e.g., LPSM format version, length, period, count, and substream association values, as indicated in Table 2 below), and after the header, the LPSM and the program boundary metadata. The program boundary metadata may include a program boundary frame count, and a code value (e.g., an "offset_exist" value) indicative of whether the frame includes only a program boundary frame count or both a program boundary frame count and an offset value), and (in some cases) an offset value.

In some implementations, parser 205 (and/or decoder stage 202) is configured to extract, from a waste bit segment, or an "addbsi" field, or an auxdata field, of a frame of the bitstream, each metadata segment having the following format:

a core header (typically including a syncword identifying the start of the metadata segment, followed by at least one identification value, e.g., the Core element version, length, and period, extended element count, and substream association values indicated in Table 1 below); and after the core header, at least one protection value (e.g., the HMAC digest and Audio Fingerprint values of Table 1) useful for at least one of decryption, authentication, or validation of at least one of loudness processing state metadata or the corresponding audio data); and also after the core header, if the metadata segment includes LPSM, LPSM payload identification ("ID") and LPSM payload size values which identify following metadata as an LPSM payload and indicate size of the LPSM payload.

The LPSM payload (or container) segment (preferably having the above-specified format) follows the LPSM payload ID and LPSM payload size values.

More generally, the encoded audio bitstream generated by preferred embodiments of the invention has a structure which provides a mechanism to label metadata elements and sub-elements as core (mandatory) or expanded (optional elements). This allows the data rate of the bitstream (including its metadata) to scale across numerous applications. The core (mandatory) elements of the preferred bitstream syntax should also be capable of signaling that expanded (optional) elements associated with the audio content are present (in-band) and/or in a remote location (out of band).

Core element(s) are required to be present in every frame of the bitstream. Some sub-elements of core elements are optional and may be present in any combination. Expanded elements are not required to be present in every frame (to limit bitrate overhead). Thus, expanded elements may be present in some frames and not others. Some sub-elements of an expanded element are optional and may be present in any combination, whereas some sub-elements of an expanded element may be mandatory (i.e., if the expanded element is present in a frame of the bitstream).

In a class of embodiments, an encoded audio bitstream comprising a sequence of audio data segments and metadata segments is generated (e.g., by an audio processing unit which embodies the invention). The audio data segments are indicative of audio data, each of at least some of the metadata segments includes loudness processing state metadata (LPSM) and optionally also program boundary metadata, and the audio data segments are time-division multiplexed with the metadata segments. In preferred embodiments in this class, each of the metadata segments has a preferred format to be described herein.

In one preferred format, the encoded bitstream is an AC-3 bitstream or an E-AC-3 bitstream, and each of the metadata segments which includes LPSM is included (e.g., by stage 107 of a preferred implementation of encoder 100) as additional bit stream information in the "addbsi" field (shown in FIG. 6) of the Bitstream Information ("BSI") segment of a frame of the bitstream, or in an auxdata field of a frame of the bitstream, or in a waste bit segment of a frame of the bitstream.

In the preferred format, each of the frames includes a core element having the format shown in Table 1 below, in the addbsi field (or waste bit segment) of the frame:

TABLE 1

| Parameter | Description | Mandatory/Optional |
|---|---|---|
| SYNC [ID] | The syncword may be a 16-bit value set to the value of 0x5838 | M |
| Core element version | | M |
| Core element length | | M |
| Core element period (xxx) | | M |
| Extended element count | Indicates the number of extended metadata elements associated with the core element. This value may increment/decrement as the bitstream is passed from production through distribution and final emission. | M |
| Substream association | Describes which substream(s) the core element is associated with. | M |
| Signature (HMAC digest) | 256-bit HMAC digest (using SHA-2 algorithm) computed over the audio data, the core element, and all expanded elements, of the entire frame. | M |
| PGM boundary countdown | Field only appears for some number of frames at the head or tail of an audio program file/stream. Thus, a core element version change could be used to signal the inclusion of this parameter. | O |
| Audio Fingerprint | Audio Fingerprint taken over some number of PCM audio samples represented by the core element period field. | O |
| Video Fingerprint | Video Fingerprint taken over some number of compressed video samples (if any) represented by the core element period field. | O |

TABLE 1-continued

| Parameter | Description | Mandatory/Optional |
|---|---|---|
| URL/UUID | This field is defined to carry a URL and/or a UUID (it may be redundant to the fingerprint) that references an external location of additional program content (essence) and/or metadata associated with the bitstream. | O |

In the preferred format, each of the addbsi (or auxdata) fields or waste bit segments which contains LPSM contains a core header (and optionally also additional core elements), and after the core header (or the core header and other core elements), the following LPSM values (parameters):

- a payload ID (identifying the metadata as LPSM) following the core element values (e.g., as specified in Table 1);
- a payload size (indicating the size of the LPSM payload) following the payload ID; and
- LPSM data (following the payload ID and payload size value) having format as indicated in the following table (Table 2):

TABLE 2

| LPSM Parameter [Intelligent Loudness] | Description | number of unique states | Mandatory/Optional | Insertion Rate (Period of updating of the para-meter) |
|---|---|---|---|---|
| LPSM version | | | M | |
| LPSM period (xxx) | Applicable to xxx fields only | | M | |
| LPSM count | | | M | |
| LPSM substream association | | | M | |
| Dialog channel(s) | Indicates which combination of L, C & R audio channels contain speech over the previous 0.5 seconds. When, speech is not present in any L, C or R combination, then this parameter shall indicate "no dialog" | 8 | M | ~0.5 seconds (typical) |
| Loudness Regulation Type | Indicates that the associated audio data stream is in compliance with a specific set of regulations (e.g., ATSC A/85 or EBU R128) | 8 | M | Frame |
| Dialog gated Loudness Correction flag | Indicates if the associated audio stream has been corrected based on dialog gating | 2 | O (only present if Loudness_Regulation_Type indicates that the corresponding audio is UNCORRECTED) | Frame |
| Loudness Correction Type | Indicates if the associated audio stream has been corrected with an infinite look-ahead (file-based) or with a realtime (RT) loudness and dynamic range controller. | 2 | O (only present if Loudness_Regulation_Type indicates that the corresponding audio is UNCORRECTED) | Frame |
| ITU Relative Gated Loudness (INF) | Indicates the ITU-R BS.1770-3 integrated loudness of the associated audio stream w/o metadata applied (e.g., 7 bits: −58 -> +5.5 LKFS 0.5 LKFS steps) | 128 | O | 1 sec |
| ITU Speech Gated Loudness (INF) | Indicates the ITU-R BS.1770-1/3 integrated loudness of the speech/dialog of the associated audio stream w/o metadata applied (e.g., 7 bits: −58 -> +5.5 LKFS 0.5 LKFS steps) | 128 | O | 1 sec |
| ITU (EBU 3341) Short-term 3 s Loudness | Indicates the 3-second ungated ITU (ITU-BS.1771-1) loudness of the associated audio stream w/o metadata applied (sliding window) @ ~10 Hz insertion rate (e.g., 8 bits: 116 -> +11.5 LKFS 0.5 LKFS steps) | 256 | O | 0.1 sec |

TABLE 2-continued

| LPSM Parameter [Intelligent Loudness] | Description | number of unique states | Mandatory/Optional | Insertion Rate (Period of updating of the para-meter) |
|---|---|---|---|---|
| True Peak value | Indicates the ITU-R BS.1770-3 Annex 2 TruePeak value (dB TP) of the associated audio stream w/o metadata applied. (i.e., largest value over frame period signaled in element period field) 116 -> +11.5 LKFS 0.5 LKFS steps | 256 | O | 0.5 sec |
| Downmix Offset | Indicates downmix loudness offset | | | |
| Program Boundary | Indicates, in frames, when a program boundary will or has occurred. When program boundary is not at frame boundary, optional sample offset will indicate how far in frame actual program boundary occurs | | | |

In another preferred format of an encoded bitstream generated in accordance with the invention, the bitstream is an AC-3 bitstream or an E-AC-3 bitstream, and each of the metadata segments which includes LPSM (and optionally also program boundary metadata) is included (e.g., by stage 107 of a preferred implementation of encoder 100) in any of: a waste bit segment of a frame of the bitstream; or an "addbsi" field (shown in FIG. 6) of the Bitstream Information ("BSI") segment of a frame of the bitstream; or an auxdata field (e.g., the AUX segment shown in FIG. 4) at the end of a frame of the bitstream. A frame may include one or two metadata segments, each of which includes LPSM, and if the frame includes two metadata segments, one may be present in the addbsi field of the frame and the other in the AUX field of the frame. Each metadata segment including LPSM has the format specified above with reference to Tables 1 and 2 above (i.e., it includes the core elements specified in Table 1, followed by the payload ID (identifying the metadata as LPSM) and payload size values specified above, followed by the payload (the LPSM data which has format as indicated in Table 2).

In another preferred format, the encoded bitstream is a Dolby E bitstream, and each of the metadata segments which includes LPSM (and optionally also program boundary metadata) is the first N sample locations of the Dolby E guard band interval. A Dolby E bitstream including such a metadata segment which includes LPSM preferably includes a value indicative of LPSM payload length signaled in the Pd word of the SMPTE 337M preamble (the SMPTE 337M Pa word repetition rate preferably remains identical to associated video frame rate).

In a preferred format, in which the encoded bitstream is an E-AC-3 bitstream, each of the metadata segments which includes LPSM (and optionally also program boundary metadata) is included (e.g., by stage 107 of a preferred implementation of encoder 100) as additional bitstream information in a waste bit segment, or in the "addbsi" field of the Bitstream Information ("BSI") segment, of a frame of the bitstream. We next describe additional aspects of encoding an E-AC-3 bitstream with LPSM in this preferred format:

1. during generation of an E-AC-3 bitstream, while the E-AC-3 encoder (which inserts the LPSM values into the bitstream) is "active," for every frame (syncframe) generated, the bitstream should include a metadata block (including LPSM) carried in the addbsi field (or waste bit segment) of the frame. The bits required to carry the metadata block should not increase the encoder bitrate (frame length);
2. Every metadata block (containing LPSM) should contain the following information:
    loudness_correction_type_flag: where '1' indicates the loudness of the corresponding audio data was corrected upstream from the encoder, and '0' indicates the loudness was corrected by a loudness corrector embedded in the encoder (e.g., loudness processor 103 of encoder 100 of FIG. 2);
    speech_channel: indicates which source channel(s) contain speech (over the previous 0.5 sec). If no speech is detected, this shall be indicated as such;
    speech_loudness: indicates the integrated speech loudness of each corresponding audio channel which contains speech (over the previous 0.5 sec);
    ITU_loudness: indicates the integrated ITU BS.1770-3 loudness of each corresponding audio channel; and
    gain: loudness composite gain(s) for reversal in a decoder (to demonstrate reversibility);
3. While the E-AC-3 encoder (which inserts the LPSM values into the bitstream) is "active" and is receiving an AC-3 frame with a 'trust' flag, the loudness controller in the encoder (e.g., loudness processor 103 of encoder 100 of FIG. 2) should be bypassed. The 'trusted' source dialnorm and DRC values should be passed through (e.g., by generator 106 of encoder 100) to the E-AC-3 encoder component (e.g., stage 107 of encoder 100). The LPSM block generation continues and the loudness_correction_type_flag is set to '1'. The loudness controller bypass sequence must be synchronized to the start of the decoded AC-3 frame where the 'trust' flag appears. The loudness controller bypass sequence should be implemented as follows: the leveler_amount control is decremented from a value of 9 to a value of 0 over 10 audio block periods (i.e. 53.3 msec) and the leveler_back_end_meter control is placed into bypass mode (this operation should result in a seamless transition). The term "trusted" bypass of the leveler implies that the source bitstream's dialnorm value is also re-utilized at the output of the encoder. (e.g. if the 'trusted' source bitstream has a dialnorm value of −30 then the output of the encoder should utilize −30 for the outbound dialnorm value);

4. While the E-AC-3 encoder (which inserts the LPSM values into the bitstream) is "active" and is receiving an AC-3 frame without the 'trust' flag, the loudness controller embedded in the encoder (e.g., loudness processor 103 of encoder 100 of FIG. 2) should be active. LPSM block generation continues and the loudness_correction_type_flag is set to '0'. The loudness controller activation sequence should be synchronized to the start of the decoded AC-3 frame where the 'trust' flag disappears. The loudness controller activation sequence should be implemented as follows: the leveler_amount control is incremented from a value of 0 to a value of 9 over 1 audio block period. (i.e. 5.3 msec) and the leveler_back_end_meter control is placed into 'active' mode (this operation should result in a seamless transition and include a back_end_meter integration reset); and 5. during encoding, a graphic user interface (GUI) should indicate to a user the following parameters: "Input Audio Program: [Trusted/Untrusted]"—the state of this parameter is based on the presence of the "trust" flag within the input signal; and "Real-time Loudness Correction: [Enabled/Disabled]"—the state of this parameter is based on the whether this loudness controller embedded in the encoder is active.

When decoding an AC-3 or E-AC-3 bitstream which has LPSM (in the preferred format) included in a waste bit segment, or the "addbsi" field of the Bitstream Information ("BSI") segment, of each frame of the bitstream, the decoder should parse the LPSM block data (in the waste bit segment or addbsi field) and pass all of the extracted LPSM values to a graphic user interface (GUI). The set of extracted LPSM values is refreshed every frame.

In another preferred format of an encoded bitstream generated in accordance with the invention, the encoded bitstream is an AC-3 bitstream or an E-AC-3 bitstream, and each of the metadata segments which includes LPSM is included (e.g., by stage 107 of a preferred implementation of encoder 100) in a waste bit segment, or in an Aux segment, or as additional bit stream information in the "addbsi" field (shown in FIG. 6) of the Bitstream Information ("BSI") segment, of a frame of the bitstream. In this format (which is a variation on the format described above with references to Tables 1 and 2), each of the addbsi (or Aux or waste bit) fields which contains LPSM contains the following LPSM values:

the core elements specified in Table 1, followed by payload ID (identifying the metadata as LPSM) and payload size values, followed by the payload (LPSM data) which has the following format (similar to the mandatory elements indicated in Table 2 above):

version of LPSM payload: a 2-bit field which indicates the version of the LPSM payload;

dialchan: a 3-bit field which indicates whether the Left, Right and/or Center channels of corresponding audio data contain spoken dialog. The bit allocation of the dialchan field may be as follows: bit 0, which indicates the presence of dialog in the left channel, is stored in the most significant bit of the dialchan field; and bit 2, which indicates the presence of dialog in the center channel, is stored in the least significant bit of the dialchan field.

Each bit of the dialchan field is set to '1' if the corresponding channel contains spoken dialog during the preceding 0.5 seconds of the program;

loudregtyp: a 4-bit field which indicates which loudness regulation standard the program loudness complies with. Setting the "loudregtyp" field to '000' indicates that the LPSM does not indicate loudness regulation compliance. For example, one value of this field (e.g., 0000) may indicate that compliance with a loudness regulation standard is not indicated, another value of this field (e.g., 0001) may indicate that the audio data of the program complies with the ATSC A/85 standard, and another value of this field (e.g., 0010) may indicate that the audio data of the program complies with the EBU R128 standard. In the example, if the field is set to any value other than '0000', the loudcorrdialgat and loudcorrtyp fields should follow in the payload;

loudcorrdialgat: a one-bit field which indicates if dialog-gated loudness correction has been applied. If the loudness of the program has been corrected using dialog gating, the value of the loudcorrdialgat field is set to '1'. Otherwise it is set to '0';

loudcorrtyp: a one-bit field which indicates type of loudness correction applied to the program. If the loudness of the program has been corrected with an infinite look-ahead (file-based) loudness correction process, the value of the loudcorrtyp field is set to '0'. If the loudness of the program has been corrected using a combination of realtime loudness measurement and dynamic range control, the value of this field is set to '1';

loudrelgate: a one-bit field which indicates whether relative gated loudness data (ITU) exists. If the loudrelgate field is set to '1', a 7-bit ituloudrelgat field should follow in the payload;

loudrelgat: a 7-bit field which indicates relative gated program loudness (ITU). This field indicates the integrated loudness of the audio program, measured according to ITU-R BS.1770-3 without any gain adjustments due to dialnorm and dynamic range compression being applied. The values of 0 to 127 are interpreted as −58 LKFS to +5.5 LKFS, in 0.5 LKFS steps;

loudspchgate: a one-bit field which indicates whether speech-gated loudness data (ITU) exists. If the loudspchgate field is set to '1', a 7-bit loudspchgat field should follow in the payload;

loudspchgat: a 7-bit field which indicates speech-gated program loudness. This field indicates the integrated loudness of the entire corresponding audio program, measured according to formula (2) of ITU-R BS.1770-3 and without any gain adjustments due to dialnorm and dynamic range compression being applied. The values of 0 to 127 are interpreted as −58 to +5.5 LKFS, in 0.5 LKFS steps;

loudstrm3se: a one-bit field which indicates whether short-term (3 second) loudness data exists. If the field is set to '1', a 7-bit loudstrm3s field should follow in the payload;

loudstrm3s: a 7-bit field which indicates the ungated loudness of the preceding 3 seconds of the corresponding audio program, measured according to ITU-R BS.1771-1 and without any gain adjustments due to dialnorm and dynamic range compression being applied. The values of 0 to 256 are interpreted as −116 LKFS to +11.5 LKFS in 0.5 LKFS steps;

truepke: a one-bit field which indicates whether true peak loudness data exists. If the truepke field is set to '1', an 8-bit truepk field should follow in the payload; and truepk: an 8-bit field which indicates the true peak sample value of the program, measured according to Annex 2 of ITU-R BS.1770-3 and without any gain adjustments due to dialnorm and dynamic range compression being applied. The values of 0 to 256 are interpreted as −116 LKFS to +11.5 LKFS in 0.5 LKFS steps.

In some embodiments, the core element of a metadata segment in a waste bit segment or in an auxdata (or "addbsi") field of a frame of an AC-3 bitstream or an E-AC-3 bitstream comprises a core header (typically including identification values, e.g., core element version), and after the core header: values indicative of whether fingerprint data is (or other protection values are) included for metadata of the metadata segment, values indicative of whether external data (related to audio data corresponding to the metadata of the metadata segment) exists, payload ID and payload size values for each type of metadata (e.g., LPSM, and/or metadata of a type other than LPSM) identified by the core element, and protection values for at least one type of metadata identified by the core element. The metadata payload(s) of the metadata segment follow the core header, and are (in some cases) nested within values of the core element.

Typical embodiments of the invention include program boundary metadata in an encoded audio bitstream in an efficient manner which allows accurate and robust determination of at least one boundary between consecutive audio programs indicated by the bitstream. Typical embodiments allow accurate and robust determination of a program boundary in the sense that they allow accurate program boundary determination even in cases in which bitstreams indicative of different programs are spliced together (to generate the inventive bitstream) in a manner that truncates one or both of the spliced bitstreams (and thus discards program boundary metadata that had been included in at least one of the pre-splicing bitstreams).

In typical embodiments, the program boundary metadata in a frame of the inventive bitstream is a program boundary flag indicative of a frame count. Typically, the flag is indicative of the number of frames between the current frame (the frame which includes the flag) and a program boundary (the beginning or the end of the current audio program). In some preferred embodiments, program boundary flags are inserted in a symmetric, efficient manner at the beginning and end of each bitstream segment which is indicative of a single program (i.e., in frames occurring within some predetermined number of frames after the segment's beginning, and in frames occurring within some predetermined number of frames before the segment's end), so that when two such bitstream segments are concatenated (so as to be indicative of a sequence of two programs), the program boundary metadata can be present (e.g., symmetrically) on both sides of the boundary between the two programs.

Maximum robustness can be achieved by inserting a program boundary flag in every frame of a bitstream indicative of a program, but this would typically not be practical due to the associated increase in data rate. In typical embodiments, program boundary flags are inserted in only a subset of the frames of an encoded audio bitstream (which may be indicative of one audio program or a sequence of audio programs), and the boundary flag insertion rate is a non-increasing function of increasing separation of each of the bitstream's frames (in which a flag is inserted) from the program boundary which is nearest to said each of the frames, where "boundary flag insertion rate" denotes the average ratio of the number of frames (indicative of a program) which include a program boundary flag to the number of frames (indicative of the program) which do not include a program boundary flag, where the average is a running average over a number (e.g., relatively small number) of consecutive frames of the encoded audio bitstream.

Increasing the boundary flag insertion rate (e.g., at locations in the bitstream closer to a program boundary) increases the data rate required for delivery of the bitstream. To compensate for this, the size (number of bits) of each inserted flag is preferably decreased as the boundary flag insertion rate is increased (e.g., so that the size of the program boundary flag in the "N"th frame of the bitstream, where N is an integer, is a non-increasing function of the distance (number of frames) between the "N"th frame and the nearest program boundary). In a class of embodiments, the boundary flag insertion rate is a logarithmically decreasing function of increasing distance (of each flag insertion location) from the nearest program boundary, and for each flag-containing frame which includes one of the flags, the size of the flag in said flag-containing frame is equal to or greater than the size of each flag in a frame located closer to the nearest program boundary than is said flag-containing frame. Typically, the size of each flag is determined by an increasing function of the number of frames from the flag's insertion location to the nearest program boundary.

For example, consider the embodiment of FIGS. 8 and 9, in which each column identified by a frame number (in the top row) indicates a frame of an encoded audio bitstream. The bitstream is indicative of an audio program having a first program boundary (indicative of the beginning of the program) which occurs immediately to the left of the column identified by frame number "17" on the left side of FIG. 9, and a second program boundary (indicative of the end of the program) which occurs immediately to the right of the column identified by frame number "1" on the right side of FIG. 8. The program boundary flags included in frames shown in FIG. 8 count down the number of frames between the current frame and the second program boundary. The program boundary flags included in frames shown in FIG. 9 count up the number of frames between the current frame and the first program boundary.

In the embodiment of FIGS. 8 and 9, a program boundary flag is inserted only in each of the "$2^N$"th frames of the first X frames of the encoded bitstream after the start of the audio program indicated by the bitstream, and in each of the "$2^N$"th frames (of the last X frames of the bitstream) nearest to the end of the program indicated by the bitstream, where the program comprises Y frames, X is an integer less than or equal to Y/2, and N is a positive integer in a range from 1 to $\log_2(X)$. Thus (as indicated in FIGS. 8 and 9), a program boundary flag is inserted in the second frame (N=1) of the bitstream (the flag-containing frame nearest to the beginning of the program), in the fourth frame (N=2), in the eighth frame (N=3), and so on, and in the eighth frame from the end of the bitstream, in the fourth frame from the end of the bitstream, and in the second frame from the end of the bitstream (the flag-containing frame nearest to the end of the program). In this example, the program boundary flag in the "$2^N$"th frame from the beginning (or end) of the program comprises $\log_2(2^{N+2})$ binary bits, as indicated in FIGS. 8 and 9. Thus, the program boundary flag in the second frame (N=1) from the beginning (or end) of the program comprises $\log_2(2^{N+2})=\log_2(2^3)=3$ binary bits, and the flag in the fourth frame (N=2) from the beginning (or end) of the program comprises $\log_2(2^{N+2})=\log_2(2^4)=4$ binary bits, and so on.

In the example of FIGS. 8 and 9, the format of each program boundary flag is as follows. Each program boundary flag consists of a leading "1" bit, a sequence of "0" bits (either no "0" bit or one or more consecutive "0" bits) after the leading bit, and a two-bit trailing code. The trailing code is "11" for the flags in the last X frames of the bitstream (the frames nearest to the program end), as indicated in FIG. 8. The trailing code is "10" for the flags in the first X frames of the bitstream (the frames nearest to the beginning of the program), as indicated in FIG. 9. Thus, to read (decode) each flag, the number of zeros between the leading "1" bit and the trailing code is counted. If the trailing code is identified to be "11", the flag indicates that there are $(2^{Z+1}-1)$ frames between the current frame (the frame which includes the flag) and the program's end, where Z is the number of zeros between the flag's leading "1" bit and trailing code. The decoder can be efficiently implemented to ignore the first and last bit of each such flag, to determine the inverse of the sequence of the flag's other (intermediate) bits (e.g., if the sequence of intermediate bits is "0001" with the "1" bit being the last bit in the sequence, the inverted sequence of intermediate bits is "1000" with the "1" bit being the first bit in the inverted sequence), and to identify the binary value of the inverted sequence of intermediate bits as the index of the current frame (the frame in which the flag is included) relative to the program's end. For example, if the inverted sequence of intermediate bits is "1000", this inverted sequence has the binary value $2^4=16$, and the frame is identified as the $16^{th}$ frame before the program's end (as indicated in the column of FIG. 8 which describes frame "0").

If the trailing code is identified to be "10", the flag indicates that there are $(2^{Z+1}-1)$ frames between the start of the program and the current frame (the frame which includes the flag), where Z is the number of zeros between the flag's leading "1" bit and trailing code. The decoder can be efficiently implemented to ignore the first and last bit of each such flag, to determine the inverse of the sequence of the flag's intermediate bits (e.g., if the sequence of intermediate bits is "0001" with the "1" bit being the last bit in the sequence, the inverted sequence of intermediate bits is "1000" with the "1" bit being the first bit in the inverted sequence), and to identify the binary value of the inverted sequence of intermediate bits as the index of the current frame (the frame in which the flag is included) relative to the program's beginning. For example, if the inverted sequence of intermediate bits is "1000", this inverted sequence has the binary value $2^4=16$, and the frame is identified as the $16^{th}$ frame after the program's beginning (as indicated in the column of FIG. 9 which describes frame "32").

In the example of FIGS. 8 and 9, a program boundary flag is only present in each of the "$2^N$"th frames of the first X frames of an encoded bitstream after the start of an audio program indicated by bitstream, and in each of the "$2^N$"th frames (of the last X frames of the bitstream) nearest to the end of the program indicated by the bitstream, where the program comprises Y frames, X is an integer less than or equal to Y/2, and N is a positive integer in a range from 1 to $\log_2(X)$. Inclusion of the program boundary flags adds only an average bit rate of 1.875 bits/frame to the bit rate required to transmit the bitstream without the flags.

In a typical implementation of the embodiment of FIGS. 8 and 9 in which the bitstream is an AC-3 encoded audio bitstream, each frame contains audio content and metadata for 1536 samples of digital audio. For a sampling rate of 48 kHz, this represents 32 milliseconds of digital audio or a rate of 31.25 frames per second of audio. Thus, in such an embodiment, a program boundary flag in a frame separated by some number of frames ("X" frames) from a program boundary indicates that the boundary occurs 32X milliseconds after the end of the flag-containing frame (or 32X milliseconds before the start of the flag-containing frame).

In a typical implementation of the embodiment of FIGS. 8 and 9 in which the bitstream is an E-AC-3 encoded audio bitstream, each frame of the bitstream contains audio content and metadata for 256, 512, 768 or 1536 samples of digital audio, depending on whether the frame contains one, two, three or six blocks of audio data respectively. For a sampling rate of 48 kHz, this represents 5.333, 10.667, 16 or 32 milliseconds of digital audio respectively or a rate of 189.9, 93.75, 62.5 or 31.25 frames per second of audio respectively. Thus, in such an embodiment (assuming that each frame is indicative of 32 milliseconds of digital audio), a program boundary flag in a frame separated by some number of frames ("X" frames) from a program boundary indicates that the boundary occurs 32X milliseconds after the end of the flag-containing frame (or 32X milliseconds before the start of the flag-containing frame).

In some embodiments in which a program boundary can occur within a frame of an audio bitstream (i.e., not in alignment with the beginning or end of a frame), the program boundary metadata included in a frame of the bitstream includes a program boundary frame count (i.e., metadata indicative of the number of full frames between the beginning or end of the frame count-containing frame and a program boundary) and an offset value. The offset value is indicative of an offset (typically a number of samples) between the beginning or end of a program boundary-containing frame, and the actual location of the program boundary within the program boundary-containing frame.

Figure 10:
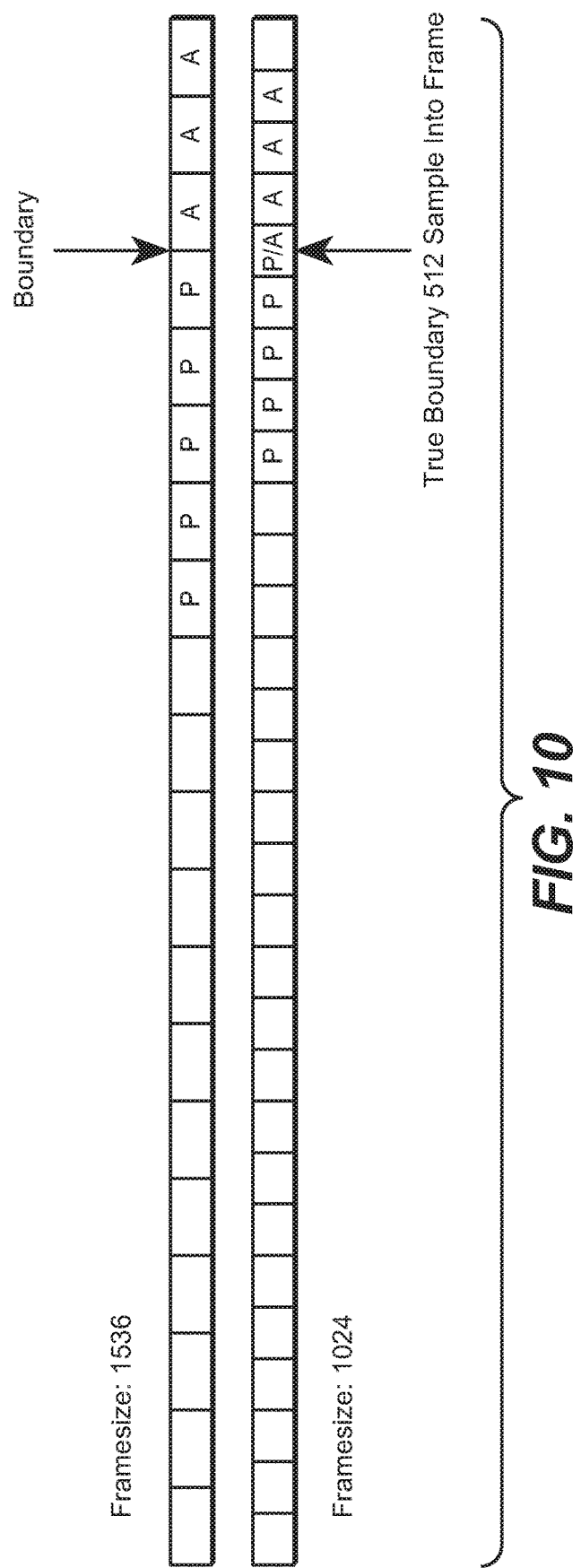
FIG. 10 is a diagram of two encoded audio bitstreams: a bitstream (IEB) in which a program boundary (labeled "Boundary") is aligned with a transition between two frames of the bitstream, and another bitstream (TB) in which a program boundary (labeled "True Boundary") is offset by 512 samples from a transition between two frames of the bitstream.

An encoded audio bitstream may be indicative of a sequence of programs (soundtracks) of a corresponding sequence of video programs, and boundaries of such audio programs tend to occur at the edges of video frames rather than at the edges of audio frames. Also, some audio codecs (e.g., E-AC-3 codecs) use audio frame sizes that are not aligned with video frames. Also, in some cases an initially encoded audio bitstream undergoes transcoding to generate a transcoded bitstream, and the initially encoded bitstream has a different frame size than does the transcoded bitstream so that a program boundary (determined by the initially encoded bitstream) is not guaranteed to occur at a frame boundary of the transcoded bitstream. For example, if the initially encoded bitstream (e.g., bitstream "IEB" of FIG. 10) has a frame size of 1536 samples per frame, and the transcoded bitstream (e.g., bitstream "TB" of FIG. 10) has a frame size of 1024 samples per frame, the transcoding process may cause the actual program boundary to occur not at a frame boundary of the transcoded bitstream but somewhere in a frame thereof (e.g., 512 samples into a frame of the transcoded bitstream, as indicated in FIG. 10), due to differing frame sizes of the different codecs. Embodiments of the present invention in which the program boundary metadata included in a frame of an encoded audio bitstream includes an offset value as well as a program boundary frame count are useful in the three cases noted in this paragraph (as well as in other cases).

The embodiment described above with reference to FIGS. 8 and 9 does not include an offset value (e.g., an offset field) in any of the frames of the encoded bitstream. In variations on this embodiment, an offset value is included in each frame of an encoded audio bitstream which includes a program boundary flag (e.g., in frames corresponding to the frames numbered 0, 8, 12, and 14 in FIG. 8, and the frames numbered 18, 20, 24, and 32 in FIG. 9).

In a class of embodiments, a data structure (in each frame of an encoded bitstream which contains the inventive program boundary metadata) includes a code value indicative of whether the frame includes only a program boundary frame count, or both a program boundary frame count and an offset value. For example, the code value may be the value of a single-bit field (to be referred to herein as an "offset_exist" field), the value "offset_exist"=0 may indicate that no offset value is included in the frame, and the value "offset_exist"=1 may indicate that both a program boundary frame count and an offset value are included in the frame.

In some embodiments, at least one frame of an AC-3 or E-AC-3 encoded audio bitstream includes a metadata segment which includes LPSM and program boundary metadata (and optionally also other metadata) for an audio program determined by the bitstream. Each such metadata segment (which may be included in an addbsi field, or an auxdata field, or a waste bit segment of the bitstream) contains a core header (and optionally also additional core elements), and after the core header (or the core header and other core elements) an LPSM payload (or container) segment having the following format:

- a header (typically including at least one identification value, e.g., LPSM format version, length, period, count, and substream association values), and
- after the header, the program boundary metadata (which may include a program boundary frame count, a code value (e.g., an "offset_exist" value) indicative of whether the frame includes only a program boundary frame count or both a program boundary frame count and an offset value, and in some cases an offset value) and the LPSM. The LPSM may include:
- at least one dialog indication value indicating whether corresponding audio data indicates dialog or does not indicate dialog (e.g., which channels of corresponding audio data indicate dialog). The dialog indication value(s) may indicate whether dialog is present in any combination of, or all of, the channels of the corresponding audio data;
- at least one loudness regulation compliance value indicating whether corresponding audio data complies with an indicated set of loudness regulations;
- at least one loudness processing value indicating at least one type of loudness processing which has been performed on the corresponding audio data; and
- at least one loudness value indicating at least one loudness (e.g., peak or average loudness) characteristic of the corresponding audio data.

In some embodiments, the LPSM payload segment includes a code value (an "offset_exist" value) indicative of whether the frame includes only a program boundary frame count or both a program boundary frame count and an offset value. For example, in one such embodiment, when such a code value indicates (e.g., when offset_exist=1) that the frame includes a program boundary frame count and an offset value, the LPSM payload segment may include an offset value which is an 11-bit unsigned integer (i.e., having value from 0 to 2048) and which indicates the number of additional audio samples between the signaled frame boundary (the boundary of the frame which includes the program boundary) and the actual program boundary. If the program boundary frame count indicates the number of frames (at the current frame rate) to the program boundary-containing frame, the precise location (in units of number of samples) of the program boundary (relative to the start or end of the frame which includes the LPSM payload segment) would be calculated as:

$$S = (\text{frame\_counter} * \text{frame size}) + \text{offset},$$

where S is the number of samples to the program boundary (from the start or end of the frame which includes the LPSM payload segment), "frame_counter" is the frame count indicated by the program boundary frame count, "frame size" is the number of samples per frame, and "offset" is the number of samples indicated by the offset value.

Some embodiments in which the insertion rate of program boundary flags increases near the actual program boundary implement a rule that an offset value is never included in a frame if the frame is less than or equal to some number ("Y") of frames from the frame which includes the program boundary. Typically, Y=32. For an E-AC-3 encoder which implements this rule (with Y=32), the encoder never inserts an offset value in the final second of an audio program. In this case, the receiving device is responsible for maintaining a timer and thus performing its own offset calculation (in response to program boundary metadata, including an offset value, in a frame of the encoded bitstream which is more than Y frames from the program boundary-containing frame).

For programs whose audio programs are known to be "frame aligned" to video frames of corresponding video programs (e.g., typical contribution feeds with Dolby E encoded audio), it would be superfluous to include offset values in the encoded bitstreams indicative of the audio programs. Thus, offset values will typically not be included in such encoded bitstreams.

Figure 11:
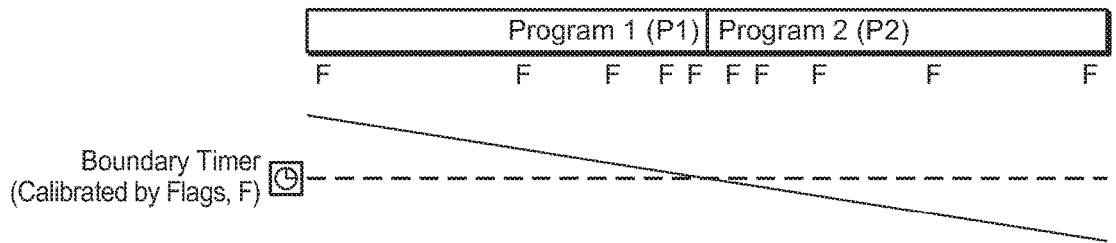
FIG. 11 is a set of diagrams showing four encoded audio bitstreams. The bitstream at the top of FIG. 11 (labeled "Scenario 1") is indicative of a first audio program (P1) including program boundary metadata followed by a second audio program (P2) which also includes program boundary metadata; the second bitstream (labeled "Scenario 2") is indicative of a first audio program (P1) which includes program boundary metadata followed by a second audio program (P2) which does not include program boundary metadata; the third bitstream (labeled "Scenario 3") is indicative of a truncated first audio program (P1) which includes program boundary metadata, and which has been spliced with an entire second audio program (P2) which includes program boundary metadata; and the fourth bitstream (labeled "Scenario 4") is indicative of a truncated first audio program (P1) which includes program boundary metadata, and a truncated second audio program (P2) which includes program boundary metadata and which has been spliced with a portion of the first audio program.
Figure 11:
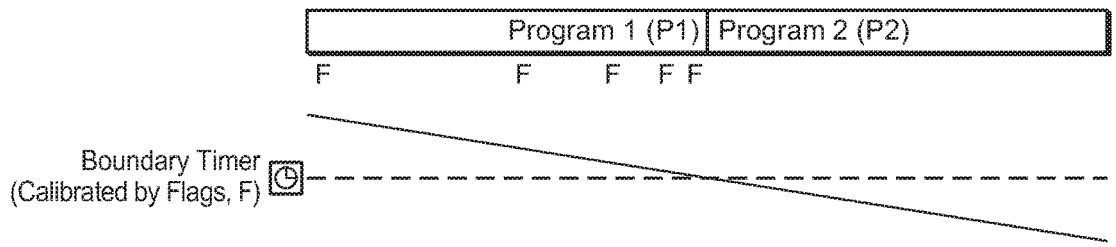
Figure 11:
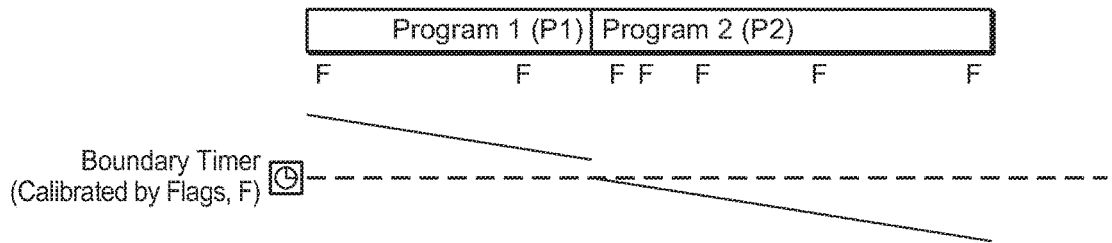
Figure 11:
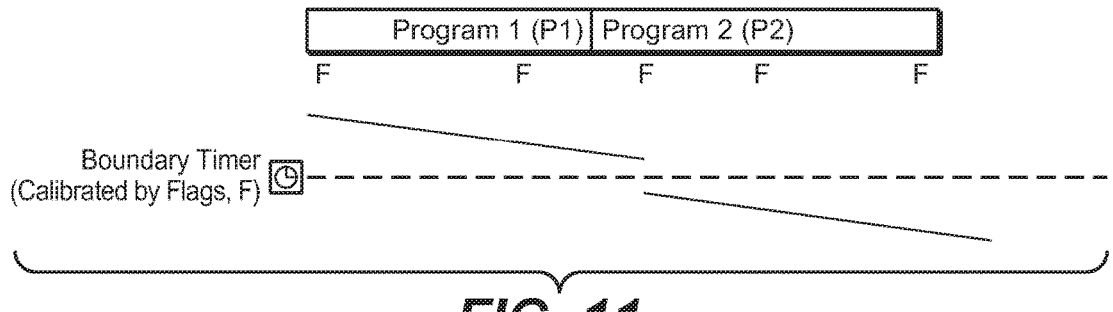

With reference to FIG. 11, we next consider cases in which encoded audio bitstreams are spliced together to generate an embodiment of the inventive audio bitstream.

The bitstream at the top of FIG. 11 (labeled "Scenario 1") is indicative of an entire first audio program (P1) including program boundary metadata (program boundary flags, F) followed by an entire second audio program (P2) which also includes program boundary metadata (program boundary flags, F). The program boundary flags in the first program's end portion (some of which are shown in FIG. 11) are identical or similar to those described with reference to FIG. 8, and determine the location of the boundary between the two programs (i.e., the boundary at the beginning of the second program). The program boundary flags in the second program's beginning portion (some of which are shown in FIG. 11) are identical or similar to those described with reference to FIG. 9, and they also determine the location of the boundary. In typical embodiments, an encoder or decoder implements a timer (calibrated by the flags in the first program) which counts down to the program boundary, and the same timer (calibrated by the flags in the second program) counts up from the same program boundary. As indicated by the boundary timer graph in Scenario 1 of FIG. 11, such a timer's countdown (calibrated by flags in the first program) reaches zero at the boundary, and timer's count up (calibrated by flags in the second program) indicates that the same location of the boundary.

The second bitstream from the top of FIG. 11 (labeled "Scenario 2") is indicative of an entire first audio program (P1) including program boundary metadata (program boundary flags, F) followed by an entire second audio program (P2) which does not include program boundary metadata. The program boundary flags in the first program's end portion (some of which are shown in FIG. 11) are identical or similar to those described with reference to FIG. 8, and determine the location of the boundary between the two programs (i.e., the boundary at the beginning of the second program), just as in Scenario 1. In typical embodiments, an encoder or decoder implements a timer (calibrated by the flags in the first program) which counts down to the program boundary, and the same timer (without being further calibrated) continues to count up from the program boundary (as indicated by the boundary timer graph in Scenario 2 of FIG. 11).

The third bitstream from the top of FIG. 11 (labeled "Scenario 3") is indicative of a truncated first audio program (P1) which includes program boundary metadata (program boundary flags, F), and which has been spliced with an entire second audio program (P2) which also includes program boundary metadata (program boundary flags, F). The splicing has removed the last "N" frames of the first program. The program boundary flags in the second program's beginning portion (some of which are shown in FIG. 11) are identical or similar to those described with reference to FIG. 9, and they determine the location of the boundary (splice) between the truncated first program and entire second program. In typical embodiments, an encoder or decoder implements a timer (calibrated by the flags in the first program) which counts down to the end of the untruncated first program, and the same timer (calibrated by the flags in the second program) counts up from the beginning of the second program. The beginning of the second program is the program boundary in Scenario 3. As indicated by the boundary timer graph in Scenario 3 of FIG. 11, such a timer's countdown (calibrated by the program boundary metadata in the first program) is reset (in response to the program boundary metadata in the second program) before it would have reached zero (in response to the program boundary metadata in the first program). Thus, although the truncation of the first program (by the splice) prevents the timer from identifying the program boundary between the truncated first program and the beginning of the second program in response to (i.e., under calibration by) program boundary metadata in the first program alone, the program metadata in the second program resets the timer, so that the reset timer correctly indicates (as the location corresponding to the "zero" count of the reset timer) the location of the program boundary between the truncated first program and the beginning of the second program.

The fourth bitstream (labeled "Scenario 4") is indicative of a truncated first audio program (P1) which includes program boundary metadata (program boundary flags, F), and a truncated second audio program (P2) which includes program boundary metadata (program boundary flags, F) and which has been spliced with a portion (the non-truncated portion) of the first audio program. The program boundary flags in the beginning portion of the entire (pre-truncation) second program (some of which are shown in FIG. 11) are identical or similar to those described with reference to FIG. 9, and the program boundary flags in the end portion of the entire (pre-truncation) first program (some of which are shown in FIG. 11) are identical or similar to those described with reference to FIG. 8. The splicing has removed the last "N" frames of the first program (and thus some of the program boundary flags that had been included therein before the splice) and the first "M" frames of the second program (and thus some of the program boundary flags that had been included therein before the splice). In typical embodiments, an encoder or decoder implements a timer (calibrated by the flags in the truncated first program) which counts down toward the end of the untruncated first program, and the same timer (calibrated by the flags in the truncated second program) counts up from the beginning of the untruncated second program. As indicated by the boundary timer graph in Scenario 4 of FIG. 11, such a timer's countdown (calibrated by the program boundary metadata in the first program) is reset (in response to the program boundary metadata in the second program) before it would have reached zero (in response to the program boundary metadata in the first program). The truncation of the first program (by the splice) prevents the timer from identifying the program boundary between the truncated first program and the beginning of the truncated second program) in response to (i.e., under calibration by) program boundary metadata in the first program alone. However, the reset timer does not correctly indicate the location of the program boundary between the end of the truncated first program and the beginning of the truncated second program. Thus, truncation of both spliced bitstreams may prevent accurate determination of the boundary between them.

Embodiments of the present invention may be implemented in hardware, firmware, or software, or a combination of both (e.g., as a programmable logic array). Unless otherwise specified, the algorithms or processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems (e.g., an implementation of any of the elements of FIG. 1, or encoder 100 of FIG. 2 (or an element thereof), or decoder 200 of FIG. 3 (or an element thereof), or post-processor 300 of FIG. 3 (or an element thereof)) each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

For example, when implemented by computer software instruction sequences, various functions and steps of embodiments of the invention may be implemented by multithreaded software instruction sequences running in suitable digital signal processing hardware, in which case the various devices, steps, and functions of the embodiments may correspond to portions of the software instructions.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be implemented as a computer-readable storage medium, configured with (i.e., storing) a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. Numerous modifications and variations of the present invention are possible in light of the above teachings. It is to be understood that within the scope of the appended claims, the invention may be practiced otherwise than as specifically described herein.

What is claimed is:

1. An audio processing apparatus for decoding an encoded audio bitstream, the audio processing apparatus comprising:
   an input buffer that stores at least a portion of the encoded audio bitstream, the encoded audio bitstream including audio data and a metadata container;
   a bitstream parser that parses the audio data; and
   a decoder that decodes the audio data,
   wherein the encoded audio bitstream is segmented into one or more frames, each frame including:
      a synchronization information section including a frame synchronization word,
      a bitstream information section following the synchronization information section, the bitstream information including audio metadata,
      an additional bitstream information section located at an end of the bitstream information section,
      up to six blocks of audio data following the bitstream information section,
      an auxiliary information section following the up to six blocks of audio data,
      an error correction word following the auxiliary information section, and
      one or more skip fields containing any unused space remaining in the frame,
   wherein at least one of the one or more frames includes the metadata container, the metadata container located in a reserved data space selected from the group consisting of the one or more skip fields, the additional bitstream information section, the auxiliary information section, or a combination thereof,
   wherein the metadata container includes:
      a header identifying a start of the metadata container, the header including a syncword followed by a length field specifying a length of the metadata container,
      a format version field following the header, the format version field specifying a format version of the metadata container,
      one or more metadata payloads following the format version field, each metadata payload including an identifier uniquely identifying the metadata payload followed by metadata of the metadata payload, and
      protection data following the one or more metadata payloads, the protection data for authenticating or validating the metadata container or the one or more metadata payloads within the metadata container, and
      wherein the one or more metadata payloads includes a program loudness payload, and the loudness payload includes a loudness regulation type field, the loudness regulation type field consisting of a 4-bit field indicating which loudness regulation standard was used to calculate a program loudness associated with the audio data.

2. The audio processing apparatus of claim 1 wherein the syncword is a 16-bit field having a value of 0x5838.

3. The audio processing apparatus of claim 1 wherein the one or more metadata payloads includes a program loudness payload, and the loudness payload includes a dialogue channel field, the dialogue channel field consisting of a 3-bit field indicating whether a left, right or center channel of the audio data contains spoken dialogue.

4. The audio processing apparatus of claim 1 wherein the one or more metadata payloads includes a program loudness payload, wherein the program loudness payload includes a loudness correction type, the loudness correction type consisting of a 1-bit field indicating whether the audio data was corrected with an infinite look-ahead or file-based loudness correction process.

5. The audio processing apparatus of claim 1 wherein the encoded audio bitstream is an AC-3 bitstream or an E-AC-3 bitstream.

6. A method for decoding an encoded audio bitstream, the method comprising:
   receiving at least a portion of the encoded audio bitstream, the encoded audio bitstream including audio data and a metadata container;
   parsing the audio data; and
   decoding the audio data,
   wherein the encoded audio bitstream is segmented into one or more frames, each frame including:
      a synchronization information section including a frame synchronization word,
      a bitstream information section following the synchronization information section, the bitstream information including audio metadata,
      an additional bitstream information section located at an end of the bitstream information section,
      up to six blocks of audio data following the bitstream information section,
      an auxiliary information section following the up to six blocks of audio data,
      an error correction word following the auxiliary information section, and
      one or more skip fields containing any unused space remaining in the frame,
   wherein at least one of the one or more frames includes the metadata container, the metadata container located in a reserved data space selected from the group consisting of the one or more skip fields, the additional bitstream information section, the auxiliary information section, or a combination thereof,
   wherein the metadata container includes:
      a header identifying a start of the metadata container, the header including a syncword followed by a length field specifying a length of the metadata container,
      a format version field following the header, the format version field specifying a format version of the metadata container,
      one or more metadata payloads following the format version field, each metadata payload including an identifier uniquely identifying the metadata payload followed by metadata of the metadata payload, and
      protection data following the one or more metadata payloads, the protection data for authenticating or validating the metadata container or the one or more metadata payloads within the metadata container, and
      wherein the one or more metadata payloads includes a program loudness payload, and the loudness payload includes a loudness regulation type field, the loudness regulation type field consisting of a 4-bit field indicating which loudness regulation standard was used to calculate a program loudness associated with the audio data.

\* \* \* \* \*